(12) United States Patent
Trakic et al.

(10) Patent No.: US 8,754,644 B2
(45) Date of Patent: Jun. 17, 2014

(54) MRI APPARATUS AND METHOD WITH MOVING FIELD COMPONENT

(75) Inventors: Adnan Trakic, Taigum (AU); Ewald Weber, Alexandra Hills (AU); Bing Keong Li, Springfield Lakes (AU); Stephen James Wilson, Camp Hill (AU); Wang Hua, St. Lucia (AU); Feng Liu, Forest Lake (AU); Stuart Crozier, Queensland (AU)

(73) Assignee: The University of Queensland, Queensland (AU)

( * ) Notice: Subject to any disclaimer, the term of this patent is extended or adjusted under 35 U.S.C. 154(b) by 423 days.

(21) Appl. No.: 13/000,312

(22) PCT Filed: Jun. 19, 2009

(86) PCT No.: PCT/AU2009/000797
§ 371 (c)(1),
(2), (4) Date: Mar. 21, 2011

(87) PCT Pub. No.: WO2009/152586
PCT Pub. Date: Dec. 23, 2009

(65) Prior Publication Data
US 2011/0210735 A1   Sep. 1, 2011

(30) Foreign Application Priority Data

Jun. 20, 2008 (AU) ............................ 2008903148
Dec. 18, 2008 (AU) ............................ 2008906515

(51) Int. Cl.
*G01V 3/00* (2006.01)

(52) U.S. Cl.
USPC .......................................... 324/307; 324/309

(58) Field of Classification Search
USPC ............................ 324/300–322; 600/407–445
See application file for complete search history.

(56) References Cited

U.S. PATENT DOCUMENTS

| 5,159,271 A * | 10/1992 | Llor .............................. 324/321 |
| 6,011,396 A * | 1/2000 | Eckels et al. .................. 324/319 |
| 6,208,142 B1 * | 3/2001 | Wagshul ....................... 324/319 |
| 6,317,619 B1 * | 11/2001 | Boernert et al. .............. 600/410 |
| 6,466,018 B1 * | 10/2002 | Dumoulin et al. ............ 324/318 |
| 6,516,211 B1 * | 2/2003 | Acker et al. .................. 600/411 |
| 6,773,408 B1 * | 8/2004 | Acker et al. ...................... 601/2 |

(Continued)

FOREIGN PATENT DOCUMENTS

WO   2007/003218   1/2007

OTHER PUBLICATIONS

International Preliminary Report on Patentability (IPRP) (Chapter I) for PCT/AU2009/000797, issued Dec. 21, 2010.

(Continued)

*Primary Examiner* — Brij Shrivastav
(74) *Attorney, Agent, or Firm* — Nixon & Vanderhye P.C.

(57) ABSTRACT

Apparatus for use in a magnetic resonance imaging system, the imaging system generating a magnetic imaging field in an imaging region (5), the apparatus including at least one coil for at least one of transmitting, receiving or transceiving an electromagnetic field, a field component (4) (such as a coil or a shield) and a drive (6) coupled to the field component for moving the field component (4) relative to the imaging region (5) to thereby modify the electromagnetic field during imaging process. The same concept can also be applied to nuclear imaging or nuclear spectroscopy apparatus.

68 Claims, 25 Drawing Sheets

(56) References Cited

U.S. PATENT DOCUMENTS

| | | | |
|---|---|---|---|
| 7,230,428 B1 * | 6/2007 | Ishii | 324/318 |
| 7,266,406 B2 * | 9/2007 | Kroeckel | 600/410 |
| 7,618,371 B2 * | 11/2009 | Younge et al. | 600/439 |
| 8,388,538 B2 * | 3/2013 | Younge et al. | 600/443 |
| 2012/0109018 A1 * | 5/2012 | Gertner et al. | 601/2 |

OTHER PUBLICATIONS

International Search Report for PCT/AU2009/000797, mailed Sep. 8, 2009.

* cited by examiner

Fig. 13A
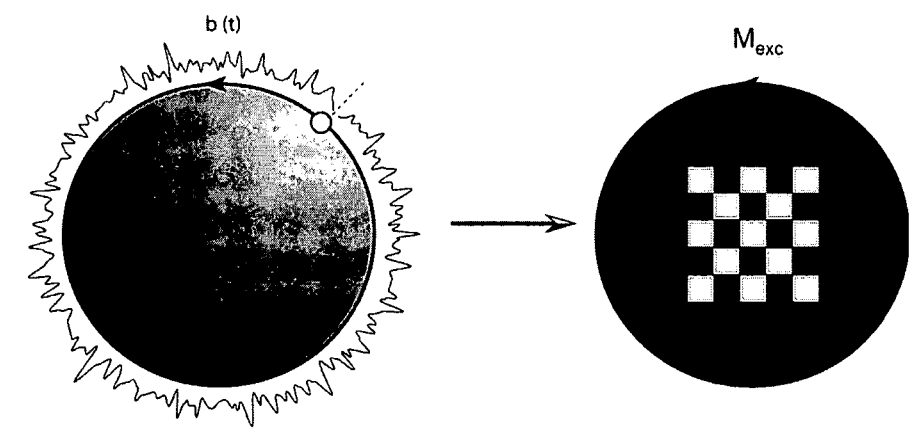
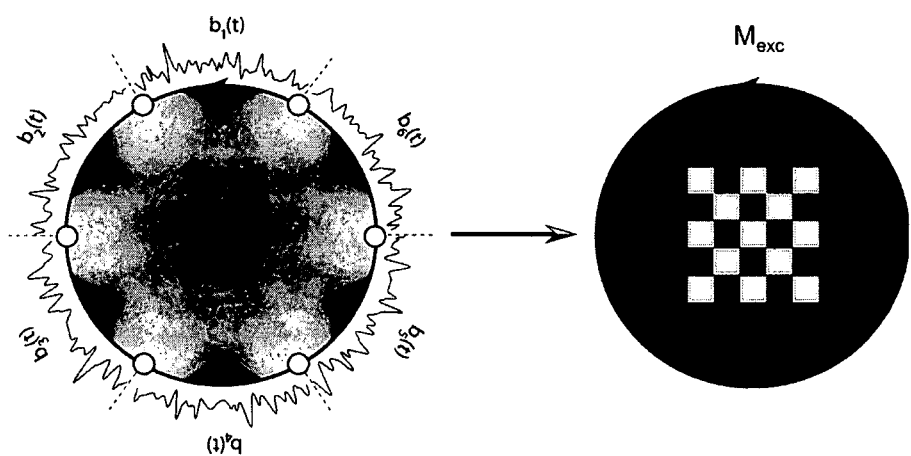
Fig. 13B

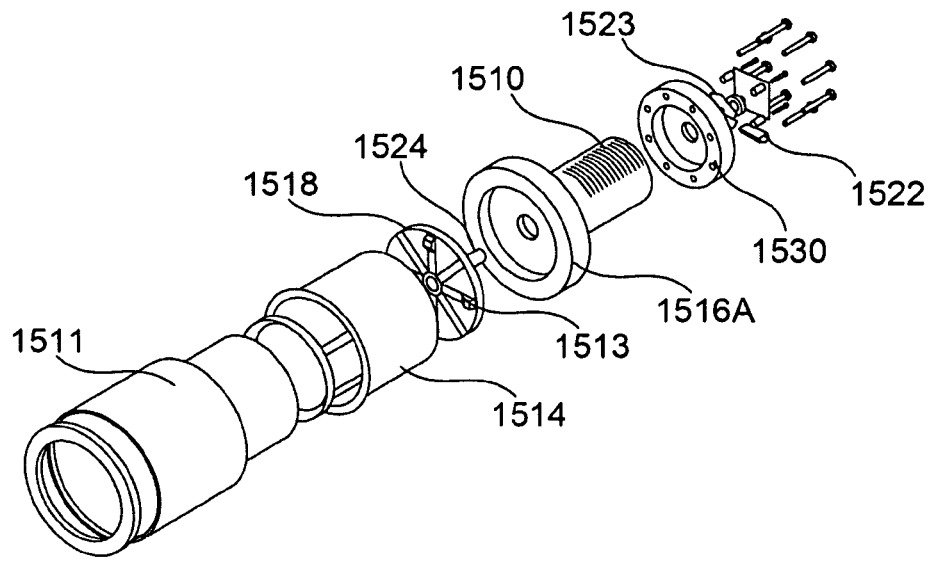
Fig. 15A
Fig. 15B  Fig. 15C
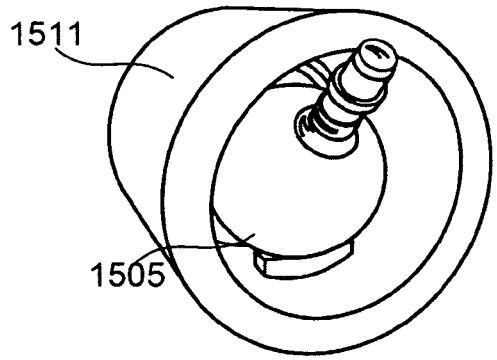 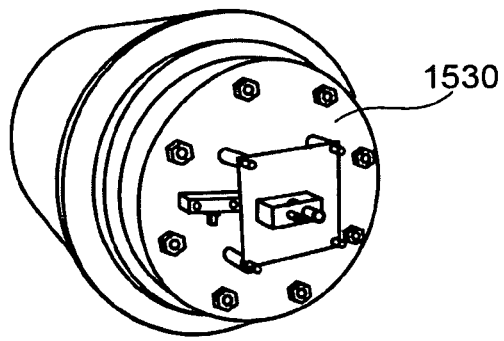
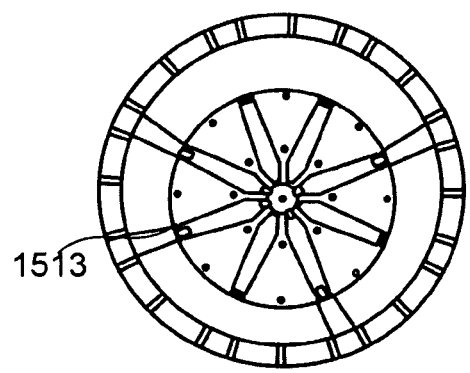 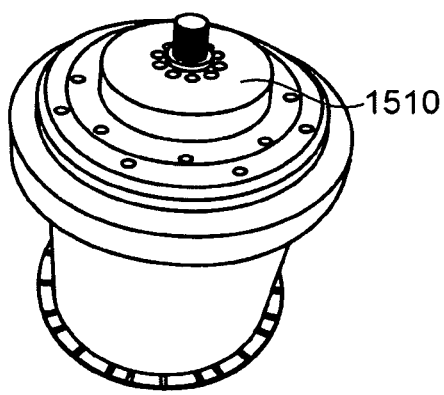
Fig. 15D  Fig. 15E

MRI APPARATUS AND METHOD WITH MOVING FIELD COMPONENT

This application is the U.S. national phase of International Application No. PCT/AU2009/000797, filed 19 Jun. 2009, which designated the U.S. and claims priority to Australian Application No(s). 2008903148, filed 20 Jun. 2008 and 2008906515, filed 18 Dec. 2008, the entire contents of each of which are hereby incorporated by reference.

BACKGROUND OF THE INVENTION

The present invention relates to apparatus and a method for moving a field component in an imaging system, and in particular, to apparatus and a method for moving a shield or coil in an imaging system, such as a magnetic resonance imaging (MRI) system.

DESCRIPTION OF THE PRIOR ART

The reference in this specification to any prior publication (or information derived from it), or to any matter which is known, is not, and should not be taken as an acknowledgment or admission or any form of suggestion that the prior publication (or information derived from it) or known matter forms part of the common general knowledge in the field of endeavour to which this specification relates.

In MRI, when a substance such as the human tissue is exposed to a strong and uniform polarizing static magnetic field $B_0$, the spins of abundant water hydrogen protons in the tissue align their individual magnetic moments along the magnetic field $B_0$, in a parallel or anti-parallel energy state. There then exists a net magnetic moment of the spin ensemble that is directed along the polarizing flux (low energy or parallel state) and processes at the characteristic Larmor frequency.

If a spatially homogeneous RF field, $B_1$, oscillating near the Larmor frequency is imposed on the imaged tissue perpendicular to the polarizing field $B_0$, the net longitudinal magnetization, $M_z$, may be 'tipped' or rotated into the plane (x-y) perpendicular to the magnetic field $B_0$ to generate a net transverse magnetization (or the excited state). When the RF field $B_1$ is expired, the net magnetization relaxes back to its original low energy state that existed before the RF field $B_1$ was applied by emitting energy in the form of an RF-signal, or colloquially free induction decay (FID), that may be captured with an RF receive coil and digitally processed to form an MR image.

During the image formation, magnetic field gradients (transverse: $G_x$, $G_y$; and longitudinal: $G_z$) are engaged to frequency encode the spatial origins of the emitted FIDs. A field gradient is generally obtained by circulating strong (time-varying) currents through a dedicated coil wire pattern, also known as the gradient coil. In general, the field of view (FOV) to be imaged is scanned by a repetitive sequence of measurements in which the gradients are pulsed according to a particular localization method. The set of received signals is digitized and recorded in the spatial frequency domain, called k-space, after which the data is inverse Fourier transformed to form the resulting image. Other suitable imaging algorithms can be also used for the image reconstruction.

The RF coils can be classified into three general categories: a) transmit/receive coils (transceive), b) transmit only coils and c) receive only coils. Transmit and receive-only coils serve as the transmitter of the RF field $B_1$ and receiver of the excited MR signal from the image of the anatomy, respectively. An important consideration during the design and implementation of transmit and receive-only coils, is that they must be electrically isolated. It means that, when the transmit-only RF coil is in operation, the receive-only RF coil has to be switched into open-circuited configuration. This blocks any large current built-up on the receive-only coil induced by the transmitted RF pulse. This prevents damaging any electronic components on and attached to the receive-only coil and in addition, minimize any existing mutual coupling effects between transmit and receive-only coils. In a similar fashion, during signal reception, the transmitting coil is switched into open-circuited configuration to minimize mutual coupling effects.

There are many types and geometries of imaging coils. Some are volume coils that surround the imaged object while others are surface coils that are placed adjacent to the periphery of the imaged object. Surface coils can be very simplistic in their geometry. They are usually in form of a circle or a rectangle in a plane and are often made to be flexible. Surface coils are very popular and widely used as they can improve the signal-to-noise ratio (SNR) figure for tissues adjacent to the coil. Unfortunately surface coils are not feasible as transmit coils, since they can not excite a large proportion of anatomy with a uniform spatial distribution of the RF field $B_1$.

Birdcage coils, on the other hand, are frequently used for the transmission of the $B_1$ field. They are in the form of a cylinder, where currents I are allowed to flow only along the longitudinal z-axis with an azimuthal $\phi$ variation such as $I_z = I_0 \cos \phi$. The field within this cylinder is therefore transverse to the magnetic field $B_0$. Commonly the current distribution is approximated by a system of rods that conduct the RF current in a longitudinal direction. The number of rods is often chosen to be 8 or 16 (other numbers can be used) and they are supported by two end rings. These rods together with the ring segments between them act as inductances in a slow-wave structure. The wave propagation is along the coil circumference.

Capacitances on the circle segments between the rods can be appropriately chosen to adjust the wavelength along the circumference of the birdcage coil. In this way, the wavelength can be set to equal the circumference of the end ring, which ultimately satisfies the criterion $I_z = I_0 \cos \phi$.

RF transmitter coils are commonly shielded by passive conductive elements, placed a certain distance away from the transmit coil. This distance is matched to the wavelength criteria so that the energy transmitted away from the sample is reflected and focused back to the imaged object. In this way, power losses to the environment are minimized.

During imaging, pulsing of gradient coils brings about a range of system limitations and deleterious effects. For instance, the time-varying fields generated by the gradient coils interact with the patient/radiology staff to induce peripheral nerve stimulation (PNS) in tissue. For combinations of large gradient field strengths and fast switching rates, a wide range of PNS-linked physiological reactions such as sensations in skin, muscle twitching, dizziness and even pain have been reported [The Institute of Electrical and Electronics Engineers (IEEE), C95.6: Standard for Safety Levels with Respect to Human Exposure to Electromagnetic Fields (0-3 kHz), New York, 2002].

Conductive transducers and instrumentation systems within the field gradients will also be vulnerable to induced voltages due to possible conductive paths. Such artefactual signals can be orders of magnitude greater than the desired signal and possess spectral characteristics similar to the desired signal. An example of such interaction is the measurement of the surface electrocardiograph (ECG).

The interaction of gradient-pulsed fields with conducting MRI system components stimulates spatially and temporally complex eddy currents that can significantly affect the intended space-time qualities of the field gradients along with torques/forces that often introduce significant levels of acoustic noise and vibration in the system. The electromagnetic field—conductor interactions are also related to various types of image artefacts that may be observed during MR examinations. More importantly, the combination of large gradient coil intrinsic inductance and resistance sets a limit on the maximum slew rate, thus directly impinging on the minimum allowable pulse train time length for a given imaging method.

Although a significant research contribution was made in the last two-three decades on these well-known issues, there is yet no full solution that completely eradicates the aforementioned issues and side-effects caused by switching of MR gradient coils.

A method known as receive SENSitivity Encoding ('receive SENSE') [Pruessmann et al, Magn Reson Med 49(5) pg 952-962, 1999] accomplishes a reduction of scan time by means of arrays of multiple stationary receiver coils, where each coil is accompanied by a chain of electronic components, colloquially known as the 'channel'. In receive SENSE, the receiver coil sensitivity pattern generally has an encoding effect complementary to Fourier preparation by field gradients. So, as the number of receiver coils increases, the application of gradient fields over time decreases, thus shortening the image acquisition time and reducing any deleterious effects that are introduced by the use of gradient coils. To achieve larger time reduction factors whilst complying with the sampling theory, the number of coil sensitivities must increase. However, increasing the number of receiver coils, increases the number of lumped components and hence the difficulties to properly decouple the coils. Additionally, increasing the number of required hardware channels increases the system cost.

Another paradigm in MRI is related to the signal-to-noise ratio (SNR). To increase SNR and improve image resolution/contrast, the strength of the static magnetic field $B_0$ has to be increased. However, at high field strength, field/tissue interactions become pronounced causing dielectric resonance effects, which precipitate the RF inhomogeneity. To correct for these distortions, field focusing methods have been proposed. In our co-pending international patent application number (IP/WO2006/094354), a focusing scheme is described for a multi-element RF system that can ameliorate the high field dielectric resonance effects. The invention is described with reference to a number of small local coils with particular application to the head and chest. The content of the co-pending application is incorporated herein by reference.

Another alternative for RF field $B_1$ inhomogeneity correction is through multi-dimensional RF pulses which are applied in conjunction with gradient fields to impart a target excitation profile. Multi-dimensional RF pulses are also normally employed in spatially selective excitation. Unfortunately, the RF transmission time can be quite long as the applied gradient fields are limited by the slew rates of the gradient coils. This can have significant implications on the signal intensity and image contrast as the spins dephase due to $T_1$ and $T_2^*$ relaxation phenomena. In order to reduce the RF transmission time, a concept known as transmit SENSitivity Encoding ('transmit SENSE') was developed [Katscher et al, Magn Reson Med 49(1) pg 144-150, 2003].

Transmit SENSE is based on a parallel excitation architecture that involves a plurality of coil elements, each with its own sensitivity pattern and driven by an independent hardware channel. The method of transmit SENSE is a close reciprocal of the theory of receive SENSE. Application of apt RF field $B_1$ waveforms on each transmit channel produces a particular target excitation pattern. More importantly, transmit SENSE employs individual RF field $B_1$ sensitivity patterns to suppress aliasing arising from sampling density reduction in the excitation k-space. Ultimately, by parallelizing the excitation, transmit SENSE allows for a reduction of both the RF field $B_1$ excitation pulse and gradient train length, and therefore the overall RF transmission time. Akin to receive SENSE, transmit SENSE suffers from significant mutual coupling associated with large coil arrays.

The current trend is, however, to fuse both transmit and receive SENSE technologies into one single system that can be used in transceive mode. At present, receive and transmit SENSE architectures often consist of a large number of lumped circuit elements and multiple hardware channels. Therefore the trend for a larger scan time reduction necessitates an even larger number of transceive coils and channels, which ultimately augments the physical complexity and the cost of the apparatus.

It would therefore be desirable to have a transceive system and method capable of realizing selected excitation and signal reception with one or a small number of coils and related hardware channels while facilitating improved image quality, reduction in the overall scan time and minimization of deleterious effects arising from switching of magnetic field gradient coils.

U.S. Pat. No. 6,317,619 describes means for generating MR images by a moveable RF coil which can be moved across a patient during an MR examination. The MR apparatus includes a position detection system which detects the current position and orientation of the moveable RF coil. Once the apparatus is moved to the desired location, it remains stationary therein during the imaging process (i.e. not moving during imaging). The coil can be hand held for manual movement or can be attached to mechanical manipulators for controlled movement and positioning. The imaging methods determine and generate magnetic gradient and RF pulse sequences to excite nuclear magnetization in a 3D region determined with respect to the current 3D position and 3D orientation of the moveable RF coil.

SUMMARY OF THE PRESENT INVENTION

The present invention seeks to substantially overcome, or at least ameliorate, one or more disadvantages of existing arrangements.

In a first broad form the present invention seeks to provide apparatus for use in a magnetic resonance imaging system, the imaging system being for generating a magnetic imaging field in an imaging region, the apparatus including:
  a) at least one coil for at least one of transmitting, receiving or transceiving an electromagnetic field;
  b) a field component; and,
  c) a drive coupled to the field component for moving the field component relative to the imaging region to thereby modify the electromagnetic field.

Typically the field component is at least one of:
  a) the at least one coil; and,
  b) a shield for partially shielding the at least one coil from the imaging region; and, Typically movement of the field component is for modifying at least one of:
  a) the electromagnetic field generated by the at least one coil; and,
  b) a sensitivity distribution of the at least one coil.

Typically the drive is for at least one of:
a) rotating the field component; and,
b) moving the field component in a plane.

Typically the drive is for rotating the at least one coil about a rotation axis.

Typically a coil axis of the at least one coil is at least one of:
a) aligned with the rotation axis; and,
b) perpendicular to the rotation axis.

Typically the at least one coil is offset to the rotation axis.

Typically the rotation axis is aligned with the imaging region.

Typically the field component includes a shield, the shield being a slotted shield structure.

Typically the drive includes at least one of:
a) a motor; and,
b) a turbine.

Typically the drive is at least one of:
a) electric;
b) piezoelectric;
c) pneumatic;
d) hydraulic; and,
e) non-magnetic.

Typically the apparatus includes a sensor for sensing movement of the field component.

Typically the apparatus includes a processing system for at least one of:
a) controlling movement of the field component; and,
b) determining movement of the field component.

Typically the processing system determines at least one of:
a) a frequency of rotation of the field component; and,
b) a field component movement speed.

Typically the processing system at least one of:
a) analyses measurements at least partially in accordance with the determined field component movement; and,
b) causes an electromagnetic field to be transmitted at least partially in accordance with the determined field component movement.

Typically the processing system controls movement of the field component in accordance with at least one of:
a) a frequency of a transmitted electromagnetic field; and,
b) frequencies of a sequence of transmitted electromagnetic fields.

Typically the processing system triggers a measurement procedure.

Typically the apparatus includes a processing system for at least one of:
a) causing signals to be applied to the at least one coil; and,
b) determining signals measured in the at least one coil.

Typically the at least one coil is wirelessly coupled to the processing system.

Typically the at least one coil is at least one of inductively and capacitively coupled to the processing system.

Typically the processing system causes measurements to be performed whilst the field component is moving.

Typically the apparatus includes a plurality of coils, and wherein in use, each coil is used for at least one of:
a) transmitting (a segment of) electromagnetic pulse samples; and,
b) receiving respective decay or echo signals.

Typically the apparatus includes a plurality of coils arranged to image a three-dimensional (3D) volume of a subject.

Typically each coil is tuned to a different frequency in order to at least one of:
a) transmitting electromagnetic pulse samples to a respective slice of the subject; and,
b) receiving a respective decay or echo signals from a respective slice of the subject.

Typically the apparatus is adapted for at least one of:
a) Multi-nuclear imaging.
b) Multi-nuclear spectroscopy Typically the field component includes a shield, the shield including at least one slot.

Typically the slotted shield includes at least one of:
a) slots of circular or elliptical geometry; and,
b) electronic components for matching resonant properties of the shield to a frequency or impedance of interest.

Typically the shield includes multiple slots arranged along a direction of multiple slices to be imaged.

Typically the slots are for differentiating the imaged slices by at least one of:
a) different geometrical properties of the slot; and,
b) different resonance frequencies of the slot.

Typically field component includes a plurality of shields, at least two shields being arranged to move independently.

Typically at least one of a geometry and material properties of the shield vary as function of space.

Typically a geometry of slot(s) in the shield is adjustable.

Typically a processing system controls the geometry of slot(s) depending on a position or movement of the field component.

Typically the shield includes adjustable electronic circuit components for adjusting electromagnetic properties of the shield.

Typically a processing system adjusts the electronic circuit components.

Typically movement of the shield can be coupled independent of the system electromagnetic coils.

Typically the field component includes a plurality of coils, at least two coils being arranged to move independently.

Typically the at least two coils are adapted to rotate about different rotation axes.

Typically the at least two coils are adapted to rotate with at least one of:
a) different speeds;
b) different accelerations; and,
c) different orientations.

Typically the apparatus is for reducing a Specific Absorption Rate (SAR) during the imaging procedure.

Typically the apparatus is for modifying the electromagnetic field so that the modified electromagnetic field provides a modulation function for amplitude encoding transmitted or received electromagnetic signals.

Typically the apparatus is for imaging by amplitude modulating/encoding the transmitted or received electromagnetic signals to and from the sample in conjunction with some or without any switching of magnetic field gradient coils.

Typically the field component is mounted on a body, the body being coupled to the drive to thereby cause movement of the body.

Typically the electromagnetic field is at least one of:
a) an RF field; and,
b) non-ionising.

Typically the apparatus includes a processing system for controlling an imaging rate by controlling at least one of:
a) a rate of movement of the field component; and,
b) a rate of sampling of signals measured in the at least one coil.

In a second broad form the present invention seeks to provide a method for use in a magnetic resonance imaging system, the imaging system being for generating a magnetic imaging field in an imaging region, and including:

a) at least one coil for at least one of transmitting, receiving or transceiving an electromagnetic field;
b) a field component; and,
c) a drive coupled to the field component, wherein the method includes moving the field component relative to the imaging region to thereby modify the electromagnetic field.

Typically the method includes moving the field component to modify at least one of:
a) an electromagnetic field generated by the at least one coil; and,
b) a sensitivity distribution of the at least one coil.

Typically the method includes, in a processing system, at least one of:
a) controlling movement of the field component; and,
b) determining movement of the field component.

Typically the method includes, controlling movement of the at least one coil in accordance with measurements being performed.

Typically the at least one coil rotates relative to the imaging region, and wherein the method includes controlling the rotation speed.

Typically the method includes controlling electromagnetic signals applied to the at least one coil.

Typically the method includes, in the processing system, controlling at least one of:
a) a frequency of rotation of the field component; and,
b) a field component movement speed.

Typically the method includes, in the processing system, determining at least one of:
a) a frequency of rotation of the field component; and,
b) a field component movement speed.

Typically the method includes, in the processing system, at least one of:
a) analysing measurements at least partially in accordance with the determined field component movement; and,
b) causing an electromagnetic field to be transmitted at least partially in accordance with the determined field component movement.

Typically the method includes, in the processing system, controlling movement of the field component in accordance with frequencies of a sequence of transmitted electromagnetic fields.

In a third broad form the present invention seeks to provide apparatus for use in a magnetic resonance imaging system, the imaging system being for generating a magnetic imaging field in an imaging region, the apparatus including:
a) at least one coil for at least one of transmitting, receiving or transceiving an electromagnetic field;
b) a field component including at least one of:
  i) the at least one coil; and,
  ii) a shield for partially shielding the at least one coil from the imaging region; and,
c) a drive coupled to the field component, wherein the method includes moving the field component relative to the imaging region using the drive.

In a fourth broad form the present invention seeks to provide a method for use in a magnetic resonance imaging system, the imaging system being for generating a magnetic imaging field in an imaging region, and including:
i) at least one coil for at least one of transmitting, receiving or transceiving an electromagnetic field;
ii) a field component including at least one of
  (1) the at least one coil; and,
  (2) a shield for partially shielding the at least one coil from the imaging region; and,
iii) a drive coupled to the field component, wherein the method includes moving the field component relative to the imaging region using the drive.

In a fifth broad form the present invention seeks to provide apparatus for use in a magnetic resonance imaging system, the imaging system being for generating a magnetic imaging field in an imaging region, the apparatus including:
a) at least one coil for at least one of transmitting, receiving or transceiving an electromagnetic field;
b) a body including at least one of:
  i) the at least one coil; and,
  ii) a shield for partially shielding the at least one coil from the imaging region; and,
c) a drive coupled to the body for moving the body relative to the imaging region, in use.

In a sixth broad form the present invention seeks to provide a method for use in a magnetic resonance imaging system, the imaging system being for generating a magnetic imaging field in an imaging region, the apparatus including:
a) at least one coil for at least one of transmitting, receiving or transceiving an electromagnetic field;
b) a body including at least one of:
  i) the at least one coil; and,
  ii) a shield for partially shielding the at least one coil from the imaging region; and,
c) a drive coupled to the body, and wherein the method includes moving the body relative to the imaging region, in use.

In a seventh broad form the present invention seeks to provide apparatus for use in a magnetic resonance imaging system, the imaging system being for generating a magnetic imaging field in an imaging region, the apparatus including:
a) a body;
b) at least one coil mounted on the body, the at least one coil being for transmitting or receiving an RF field; and,
c) a drive coupled to the body for rotating the coil relative to the imaging region, in use.

In an eighth broad form the present invention seeks to provide a method for use in imaging a sample provided in an imaging region of a magnetic resonance imaging system, the method including, in a processing system:
a) causing at least one coil to be moved relative to the imaging region, the at least one coil being for transmitting or receiving an RF field; and,
b) at least one of:
  i) causing a sequence of electrical signals to be applied to the coil; and,
  ii) determining measurements of electrical signals in the coil.

In a ninth broad form the present invention seeks to provide apparatus for use in a magnetic resonance imaging system, the imaging system being for generating a magnetic imaging field in an imaging region, the apparatus including:
a) at least one field source/sensor for at least one of transmitting, receiving or transceiving an electromagnetic field; and,
b) a drive coupled to the at least one field source/sensor for moving the at least one field source/sensor relative to the imaging region.

In a tenth broad form the present invention seeks to provide a method for use in a magnetic resonance imaging system, the imaging system being for generating a magnetic imaging field in an imaging region, the apparatus including:
a) at least one field source/sensor for at least one of transmitting, receiving or transceiving an electromagnetic field; and, b) a drive coupled to the at least one field source/sensor, the method including moving the at least one field source/sensor relative to the imaging region.

In an eleventh broad form the present invention seeks to provide apparatus for use in a magnetic resonance imaging system, the imaging system being for generating a magnetic imaging field in an imaging region, the apparatus including:
  a) a source for generating an electromagnetic field; and,
  b) means for spatially changing the electromagnetic field over time relative to a subject being imaged.

In a twelfth broad form the present invention seeks to provide a method for use in a magnetic resonance imaging system, the imaging system being for generating a magnetic imaging field in an imaging region, the method including:
  a) generating an electromagnetic field; and,
  b) spatially changing the electromagnetic field over time relative to a subject being imaged.

BRIEF DESCRIPTION OF THE DRAWINGS

An example of the present invention will now be described with reference to the accompanying drawings, in which:—

FIG. 13A is an example of serial transmission of $b_{full}/K$ RF samples with a single coil during a full 360° coil rotation;

FIG. 13B is an example of serio-parallel transmission of $b_{full}/KK$ RF samples with an array of coils during a full 360° coil rotation; and, FIGS. 14A and 14B are representations of simulated amplitude and phase plots for a stationary 8-stub birdcage resonator and a single rotated stub, respectively.

FIGS. 15A to 15E are images of a specific example of experimental imaging apparatus incorporating a coil moving apparatus;

DETAILED DESCRIPTION OF THE PREFERRED EMBODIMENTS

An example of an imaging system incorporating apparatus for moving a field component (hereinafter "moving apparatus") will now be described with reference to FIG. 1.

Figure 1:
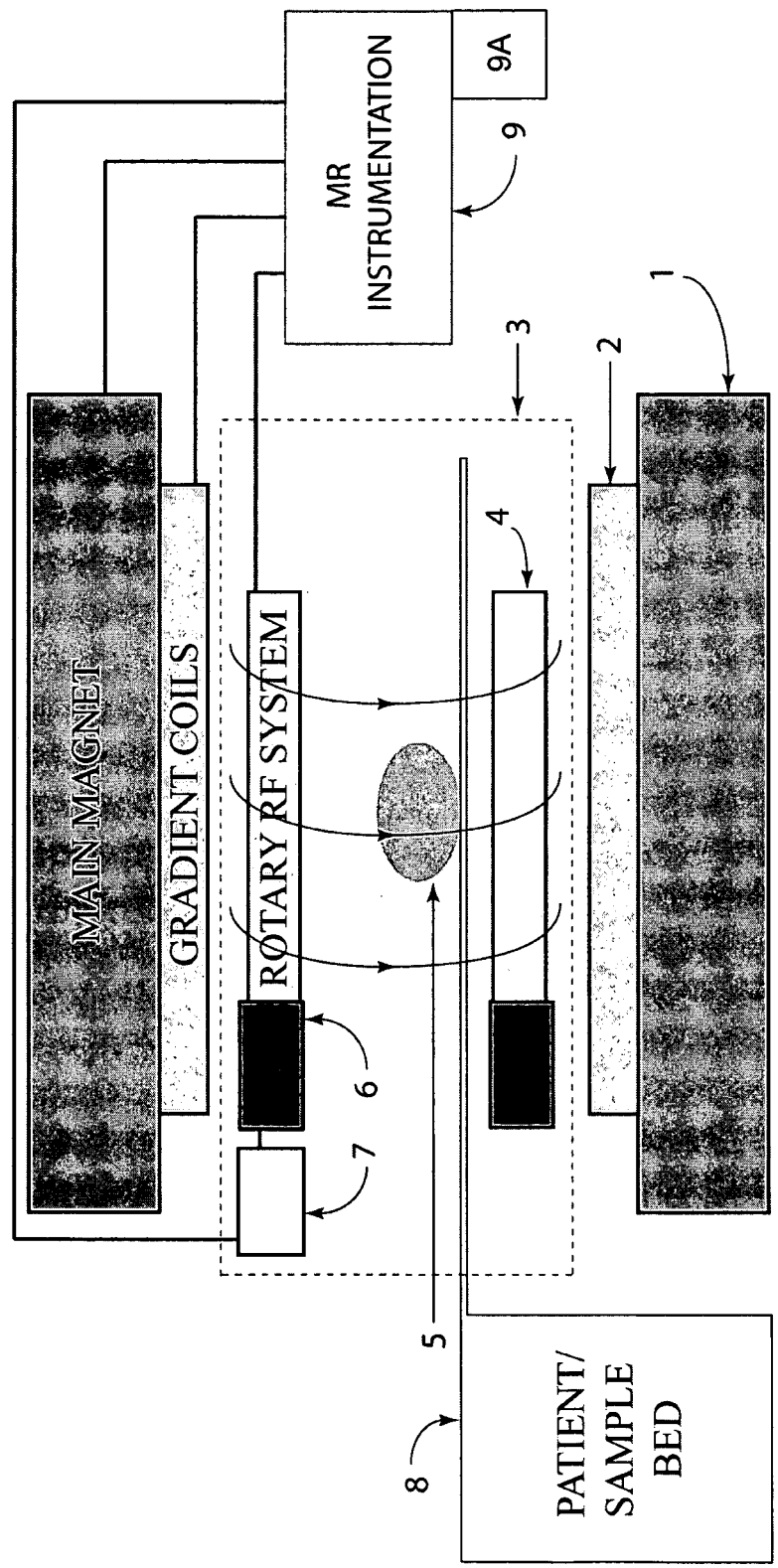
FIG. 1 is a schematic diagram of an example of an imaging system incorporating a field component moving apparatus.

For the purpose of this example, FIG. 1 shows the major components of an MR system including a main or primary shimmed magnet 1, three principal axis gradient coils 2, a patient/sample bed 8 and MR instrumentation 9. In use, the main magnet 1 is adapted to generate a substantially homogeneous magnetic field over an imaging region 5, which contains a subject, such as at least part of a patient or sample. The subject is then exposed to an RF field, allowing MRI to be performed. The workings of these components are substantially identical to those of contemporary systems, and will not therefore be described in any further detail.

In this example, the imaging system includes an RF system 3 for generating RF field or other electromagnetic fields or for sensing electromagnetic fields including emitted RF signals, such as decay or echo signals. Accordingly, the RF system typically includes a coil 4, which may be a receive only, transmit only, or transceive coil. In the event that the coil 4 is a receive or transmit only coil, it will be appreciated that another transmit or receive only coil may be provided. The RF system 3 typically also includes a moving apparatus for moving a field component relative to the imaging region to thereby modify the electromagnetic field, and in particular to influence either the profile of the RF field generated in the imaging region, or the sensitivity profile for detection of echo signals.

The apparatus therefore effectively allows imaging to be performed using an electromagnetic field that varies spatially over time relative to the object being imaged, which leads to a number of benefits, as will become apparent from the description below.

In one example, the field component is the coil 4, so that the RF system 3 acts as a coil moving apparatus 3. Accordingly, in this example, the RF system 3 includes a drive 6, for rotating or otherwise moving the coil 4 relative to the imaging region, thereby allowing a greater range of measurements to be performed, as well as to provide greater flexibility and accuracy, as will be described in more detail below.

However, as an alternative, the field component can include a shield, so that the RF system 3 acts as a shield moving apparatus. The following description will focus on the implementation of the coil moving apparatus, with the shield moving apparatus being described in more detail below with respect to FIGS. 17 to 24.

It will be appreciated from the above that the moving coil or the combination of the coil and moving shield act either as a movable source for generating the electromagnetic field, or as a movable sensor for sensing the electromagnetic field. Accordingly, the above described moving apparatus provides a movable field source/sensor for at least one of transmitting, receiving or transceiving an electromagnetic field. The ability to move the source/sensor relative to the imaging region vastly enhances the functionality of the imaging apparatus as will be evident from the description below.

Furthermore it will be appreciated that the electromagnetic field produced by the RF source can be made to change spatially over time relative to the object being imaged, while the source of electromagnetic radiation may be stationary or moving, depending on the application. As long as the electromagnetic field profile itself is changing spatially over time relative to the object, many benefits described are obtained. Thus, in another example, the apparatus can include a source for generating an electromagnetic field and means for spatially changing the electromagnetic field over time relative to a subject being imaged. This allows imaging to be performed by generating the electromagnetic field and varying the spatial profile of the field over time relative to a subject being imaged.

In the example of the coil moving apparatus, the drive 6 is a mechanical drive such as an electric, pneumatic, hydraulic or any other kind of motor or turbine. The drive 6 is preferably non-magnetic to thereby avoid interference with the measurement process, although this is not essential if the drive 6 is sufficiently shielded from the remainder of the imaging system.

In one example, the coil moving apparatus 3 also includes a controller 7 for selectively activating the drive 6 to thereby control movement of the coil 4. Additionally and/or alternatively, the controller 7 can determine measurements of coil movement and/or position from a suitable sensor. The controller 7 may therefore be of any suitable form, and in one example is a processing system, such as a field programmable gate array (FPGA), or other suitable configurable device.

The MR instrumentation 9 is also typically adapted to cause electrical signals to be applied to the coil 4, thereby causing the coil 4 to generate RF field pulses. Additionally and/or alternatively, the MR instrumentation 9 may determine measured electrical signals induced in the coil 4 by decay or echo signals. Accordingly, the MR instrumentation may include any suitable instrumentation, such as MR spectrometers, RF instrumentation and the like.

In one example, the MR instrumentation may include a suitably programmed processing system 9A, such as a computer system, or other custom processing device, that coordinates the measurement process by controlling any of the other instrumentation. The processing system 9A is shown separately for the purpose of explanation only and this is not intended to be limiting.

In one example, the measurement process or interpretation of resulting measurements may depend on the position and/or movement of the coil 4. Accordingly, in one example, the MR instrumentation 9 may communicate with the controller 7, allowing the MR instrumentation 9 to control movement of the coil 4 and/or to determine the position or movement of the coil 4. This in turn allows the MR instrumentation 9 to use this information when generating images or other data from measured decay or echo field signals, or for controlled transmission of RF pulses via the transmitter coil.

The nature of the movement generated by the drive 6 will depend on the preferred implementation. For example, the moving apparatus can be used in a range of different types of architectures, such as those of cylindrical and open MRI systems, and the particular configuration used may depend on the nature of the imaging system and the type of imaging being performed.

Examples of different coil moving arrangements will now be described with reference to FIGS. 2A to 2D.

Figure 2A:
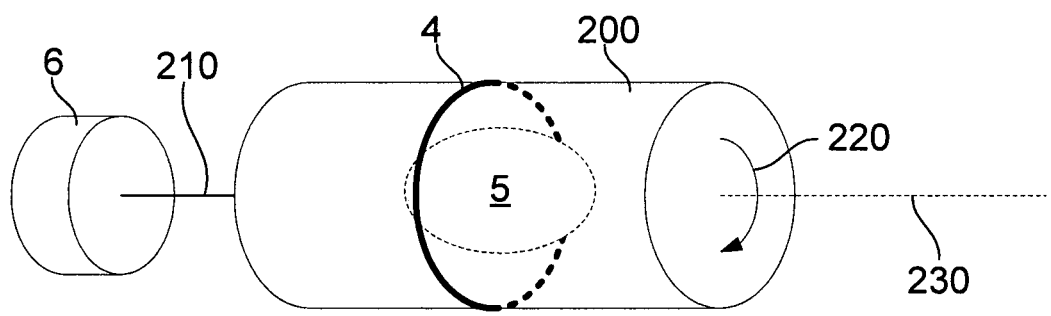
FIGS. 2A to 2D are schematic isometric views of examples of coil moving apparatus.

In the example of FIG. 2A, the coil 4 is a circular coil that extends around a circumference of a substantially cylindrical body 200, which in turn surrounds the imaging region or subject 5. The body 200 is coupled to the drive 6, via an axle 210, so that the body 200 and hence the coil 4 rotate about a rotation axis 230 (aligned with the axle 210) in the direction of arrow 220. Accordingly, in this example, the coil is a circular coil that defines a coil axis aligned with the rotation axis.

Figure 2B:
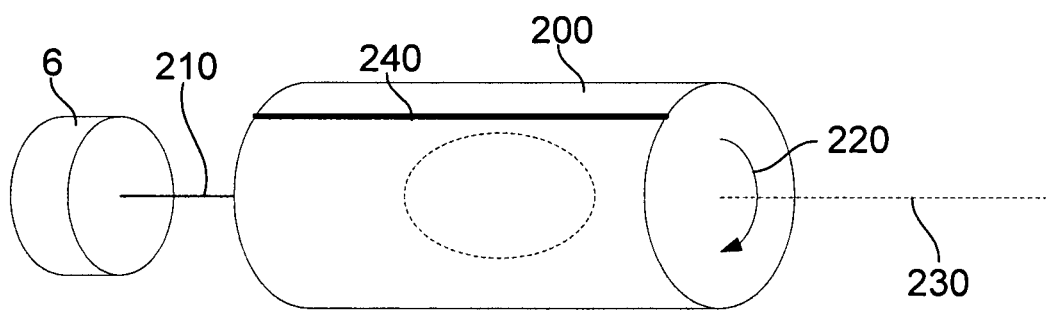

In the example of FIG. 2B, the coil 4 is made of one or more conductors 240 extending in an axial direction along the body 220. Accordingly, in this example, the coil 4 is one or more linear conductors that are rotated about the rotation axis 220.

Figure 2C:
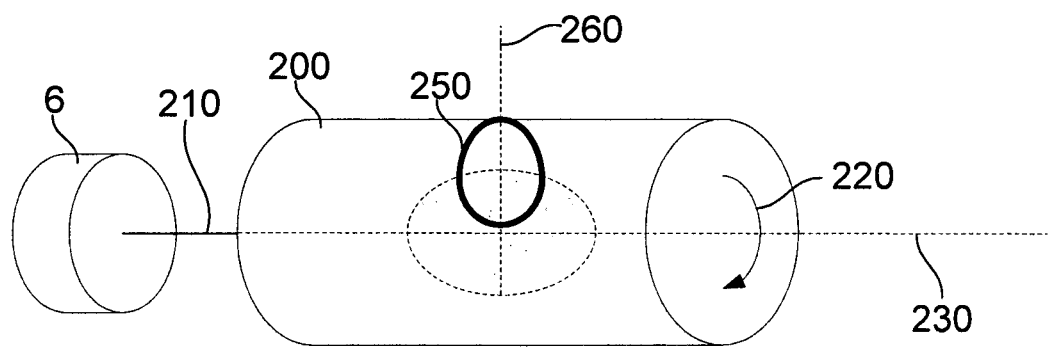

In the example of FIG. 2C, the coil 4 is a circular coil 250 provided on a surface of the body 220, so that the rotation axis 220 is perpendicular to a coil axis 260, and offset from the coil 250.

Figure 2D:
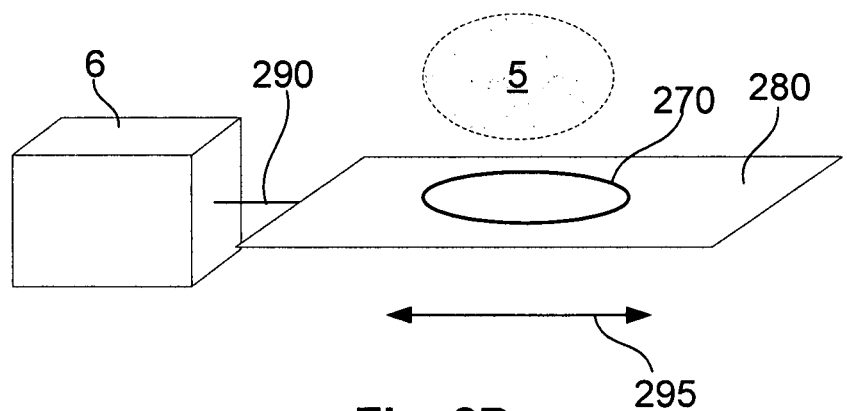

In the example of FIG. 2D, the coil 4 is a flat coil 270 provided on a planar body 280, which is coupled to a drive 6, such as a linear actuator, via a push rod 290. The linear actuator, which can be of any suitable form such as pneumatic piston, is arranged to allow reciprocal linear movement of the coil 4 relative to the imaging region 5, as shown by the arrow 295.

It will be appreciated from the above that a range of different coil configurations and relative movements can be used. Furthermore, whilst a single coil or conductor is described, it will be appreciated that a coil array having any number of coils or conductors of an arbitrary desired three-dimensional geometry/architecture, could be used.

Figure 3:
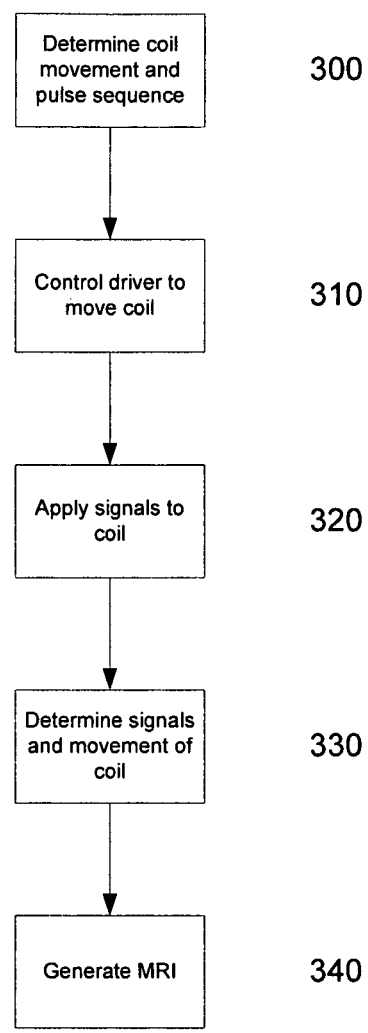
FIG. 3 is a flow chart of an example of an imaging process.

An example of a measurement process will now be described with reference to FIG. 3.

In this example, at step 300, a coil movement and pulse sequence is typically determined. This may be achieved in any suitable manner, but in one example, involves a user selecting a measurement procedure using the processing system 9A. This allows the processing system 9A to access pre-stored data representing a previously determined coil movements and pulse sequences that achieve the selected measurement procedure. Alternatively, however, this information may be provided manually.

At step 310, the processing system 9A causes the coil 4 to be moved relative to the imaging region 5. In one example, this is achieved by having the MR instrumentation 9 cause the controller 7 to activate the drive 6, thereby causing the required coil movement. As part of this process, the controller 7 may provide information regarding the position and/or movement of the coil 4, to the MR instrumentation 9, allowing this to be determined by the processing system 9A. This can be used as part of the subsequent analysis, and/or to allow the MR instrumentation 9 to trigger the measurement process, for example when the coil reaches a desired movement speed.

At step 320, the processing system 9A causes signals to be applied to the coil 4, causing the coil 4 to generate the required RF field $B_1$, to which the subject is exposed. In one example, this is achieved by having the MR instrumentation 9 cause suitable processing electronics (described in more detail below) to generate signals that are applied to the coil 4.

At step 330, the processing system 9A determines measurements of signals in the coil 4 resulting from the detected decay or echo signals, and optionally determines movement of the coil 4. The signals in the coil 4 are typically measured by suitable processing electronics, with this information being provided to the MR instrumentation 9. Similarly, the MR instrumentation 9 can determine movement of the coil 4 from the controller 7, which in turn typically determines this using a suitable sensor.

At step 340, the movement and resulting RF field are used by the MR instrumentation to generate an image or other data. The manner in which this is performed will depend on the measurement procedure performed, and examples will be described in more detail below.

It will be appreciated that in the above described example the coil 4 is acting as a transceive coil. In the event that the coil 4 is a transmit only or receive only coil, then the method would be adapted accordingly, with signals being separately received from or transmitted by a different coil.

It will also be appreciated that whilst the controller 7 and the MR instrumentation 9 are described as discrete components in the above example, this is not essential, and the function of the controller 7 and MR instrumentation 9 could be provided by a single suitably configured device.

Figures 4A, 4B:
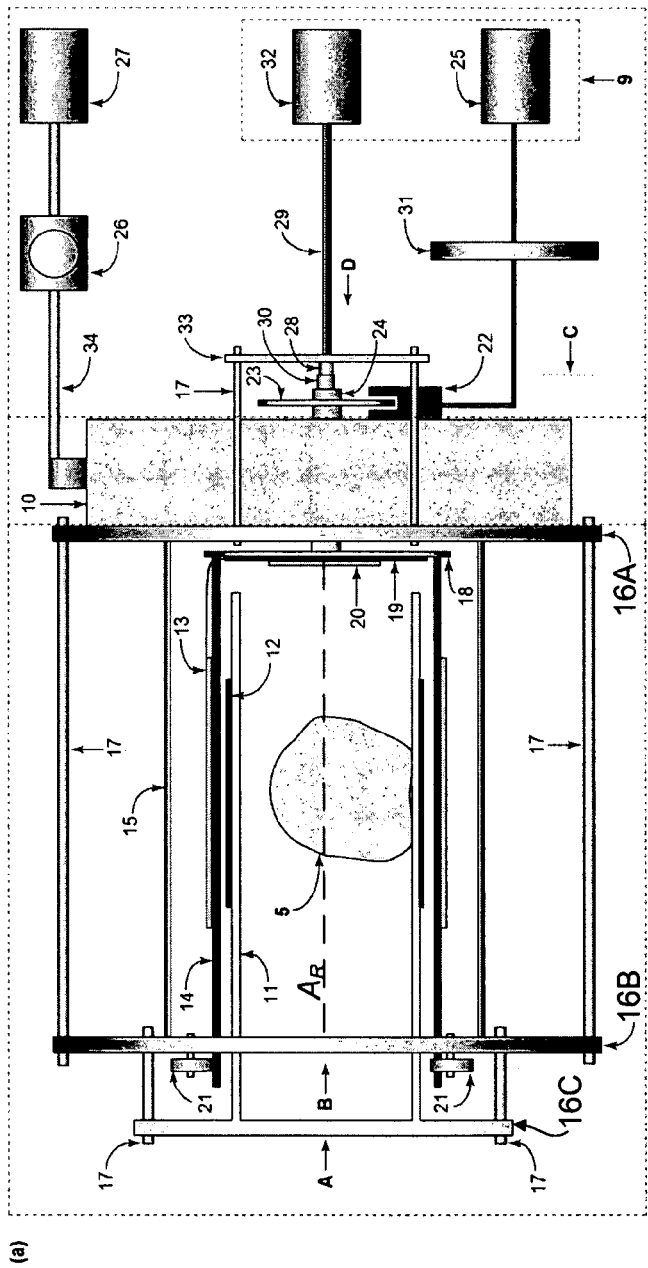
FIG. 4A is a schematic side view of a further example of coil moving apparatus.
FIG. 4B shows cross sectional views of the coil moving apparatus of FIG. 4A.

A further example of coil moving apparatus will now be described with reference to FIGS. 4A and 4B.

For the purpose of this example, a small animal/sample RF system is described in which the moving apparatus consists mostly of plastic materials and some non-magnetic electronic components that can be placed into an existing imaging system. This is for the purpose of example only, and it will be appreciated that the techniques described herein can be applied to any suitable MRI system.

For the purpose of this explanation, the term coil is understood to include either a single coil, or multiple coils provided in an array. Furthermore, the term processing system is understood to encompass any electronic system that can perform processing of or generation of signals to provide required functionality. This could therefore include any one or more of computer systems, custom processing devices, known instrumentation, or the like, and is not intended to be limiting.

In this example, the drive 6 includes a turbine 10 mounted to a support 16A. The turbine 10 may be of any suitable form, but in one example is a plastic pneumatic turbine capable of high angular velocities (up to ~10,000 rpm or more). A cylinder 14 is provided having a first end mounted to a flange 18, which is in turn coupled to the turbine 10 by a bored shaft 24. A second end of the cylinder 14 is supported by ball bearings 21 mounted on a support 16B, which is connected to the support 16A, by connecting rods 17. The arrangement is such that operation of the turbine 10 causes rotation of the cylinder 14 about a rotation axis $A_R$.

In one example, the apparatus includes a cylindrical sample tube 11, coupled to a support 16C. The support 16C can be coupled to the support 16B, via connecting rods 17, so that the sample tube is positioned radially inwardly of the cylinder 14. In use, the sample tube 11 is adapted to support a subject 5, such as a small animal or a sample, allowing these to be positioned within an imaging region of an imaging system.

Whilst other sample holding arrangements or geometries are possible, use of the sample tube 11 also allows a stationary receive or transmit-only coil 12 to be supported, allowing this to be used in cross-coil operation with a rotating transmit or receive-only coil 13 respectively, situated on the cylinder 14. However it is also possible to use a single transceive coil provided on the rotating cylinder 14, which was done in some of the experimental applications described in more detail below.

In one example, an RF shield 15 is situated on the outer periphery of the coil assembly.

The flange 18 can contain processing electronics, such as a dedicated Printed Circuit Board (PCB) 19 and other electronic components 20 required for the operation of the transceive coil (array) 13. In general, the processing electronics are coupled to the MR instrumentation 9, and in particular to a component 32, that provides active RF switching along with other standard RF instrumentation functionality, allowing the coil 13 to be used to generate an RF field $B_1$ and/or detect RF decay or echo signals. It will be appreciated that this is therefore analogous to RF instrumentation in conventional RF architectures The processing electronics and/or RF instrumentation 32 can be connected in any manner. In one example, however, this is achieved at least in part using a wireless connection, such as an inductive and/or capacitive coupling. The wireless connection can include a non-magnetic rotating inductive loop 30 attached to a right side of the turbine shaft 24, that cooperates with a fixed inductive loop 28 supported by support 33, shown in FIG. 4A. A coaxial cable 29 coupled to the RF instrumentation 32 is used to transmit energy to, and receive energy from, the inductive loop 28. The electrical link between the PCB 19 and the rotating connector component 30 can be established via a semi-rigid non-magnetic RF coaxial cable that runs through a bore of the shaft 24. In use, the fixed and rotating inductive loops are typically tuned so as to resonate at frequencies similar to those of applied signals, thereby maximising the inductive and/or capacitive coupling between the loops, and hence minimising signal losses. In one example, the fixed and inducting loops can be provided as part of a coaxial transformer.

Figure 5:
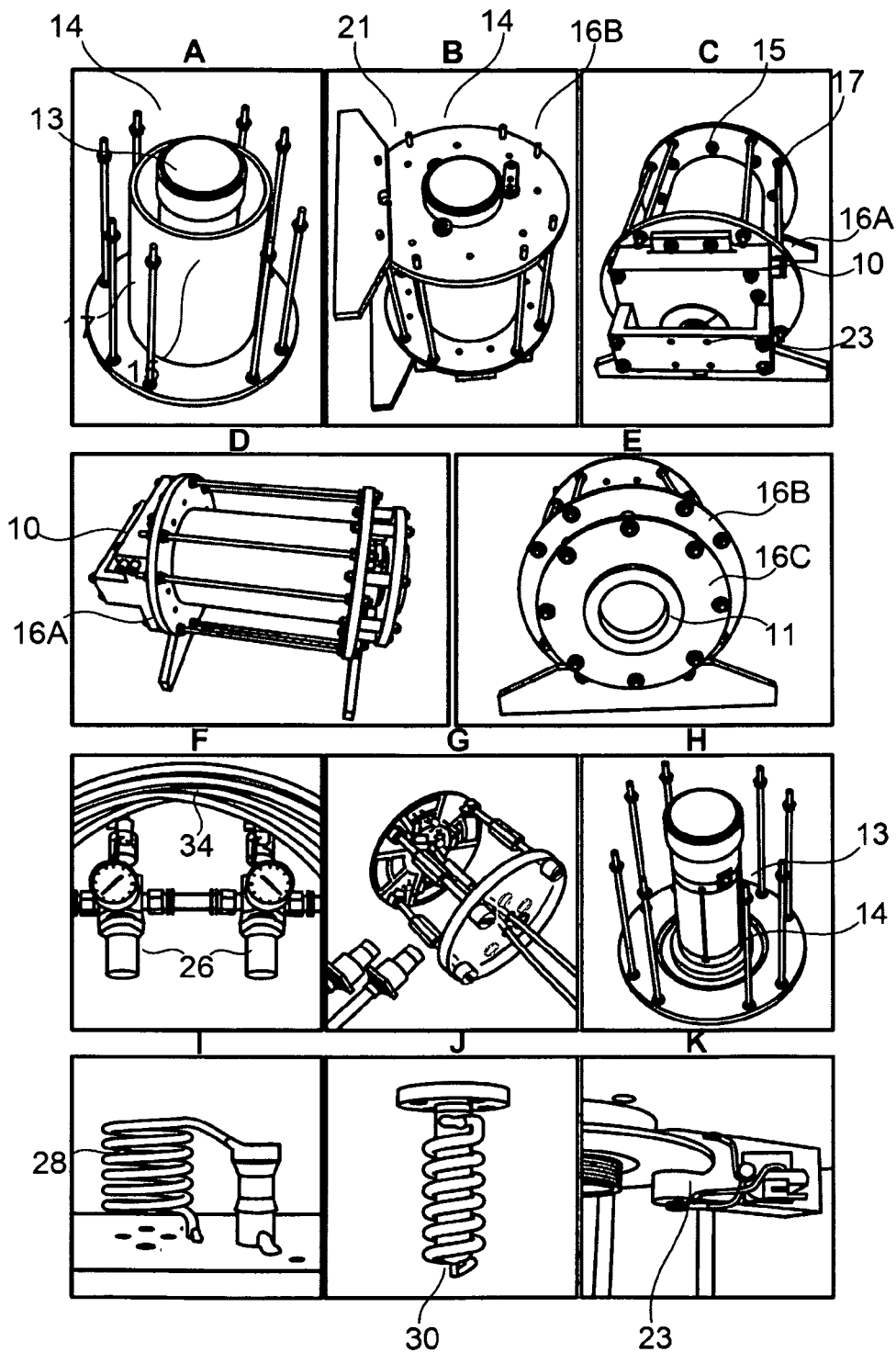
FIGS. 5A to 5K are images of a specific example of experimental imaging apparatus incorporating a coil moving apparatus.

Detailed photos of a specific implementation of the inductive connector are shown in FIGS. 5I and 5J.

It will be appreciated that this type of connection is free of frictional forces and electric noise, whilst allowing measured decay or echo signals to be received wirelessly, in which case, the complicated wiring associated with a number of rotating receive channels is eradicated.

The coil moving apparatus 3 typically includes a sensor coupled to part of MR instrumentation 9, such as an MR spectrometer 25, allowing rotation and/or a position of the cylinder 14, and hence the coil 13, to be determined. In one example, the sensor includes a non-magnetic infra-red (IR) photo interrupter 22 placed aptly near an IR semi-transparent disc 23 that is firmly attached to the shaft 24 of the turbine 10.

In order to measure the frequency of coil rotation and/or to determine the angular position of the transceive coil (array) 13, the transparent disc 23 is appropriately marked with IR reflecting tape (or fittingly coloured). The analogue signal from the photo interrupter 22 is propagated to a RF π-filter network 31 and subsequently the MR spectrometer 25, which can be used to trigger the MR imaging acquisition/sequence in an intended manner. The MR instrumentation 9 can also include a device for determining the frequency of rotation, and in one experimental example this is achieved using an oscilloscope, although any suitable technique may be used. This also may not be required depending on the application.

In one example, the coil moving apparatus includes an air compressor 27 coupled to a suitable air pressure regulator system, such as a control valve 26. The control valve 26 is in turn connected to the turbine 10 via an air hose 34. Operation of the control valve 26 can therefore be used to control rotation of the turbine 10, and hence the coil 13. In one example, the control valve can be operated manually. In this manner an open-loop control system is implemented. However, more sophisticated closed-loop control systems can be used where precise control of rotational velocity of the coil is required, and in one example this may be achieved by the MR instrumentation 9, and/or the controller 7.

A number of experimental results obtained using a moving apparatus of this type will now be described.

All experiments were performed on a whole-body 2 Tesla (T) MRI system at The University of Queensland (Brisbane, Australia). The system is equipped with ParaVision 4 software (Bruker, Germany), which was employed to program all the pulse sequences. Images of the experimental moving apparatus 3 developed at the School of Information Technology and Electrical Engineering at The University of Queensland (Brisbane, Australia), are shown in FIGS. 5A to 5J.

In this example, a single RF transceive coil 13 was constructed and situated on the rotating cylinder 14. FIG. 5A shows the transceive coil 13 positioned on the rotating cylinder 14, while surrounded by the RF shield 15. The moving apparatus is closed by a support such as ring/flange 16 and the rotating cylinder 14 is supported by acetal/glass ball bearings 21, shown in FIG. 5B. The rear view of the moving apparatus 3 in FIG. 5C shows the location of the inductive RF connectors 28, 30.

In this example, the coil 13 is tuned to 85.45 MHz and matched to a system impedance of 50Ω. A homogenous cylindrical phantom 5 measuring 45 mm in diameter and 50 mm in length, containing solution with dielectric properties of $\sigma=0.2$ S/m and $\in_r=76$, is inserted into the sample tube 11. The solution has $T_2$ and $T_1$ time constants of ~1000 ms and ~4200 ms respectively.

The sample tube 11 is then inserted into the rotary cylinder 14, with the rods 17 connecting the sample tube 11 to the support 16B. A side view of the fully assembled moving apparatus 3, showing the air turbine 10 with two air nozzles, is shown in FIG. 5D. A front view showing the mounted sample tube 11, is shown in FIG. 5E. It should be noted that the sample tube 11 may carry a stationary RF receive coil shown in FIG. 5O.

A 10 m long, Ø12 mm air hose 34 was attached and clamped to a wall outlet of a large air compressor 27 and delivered air to the turbine 10 of the rotating device 3 sitting on the patient table 8 inside of the 2T scanner. Close to the wall air outlet were two air pressure regulators 26, each rated at 150 psi, which were attached in series for manual control of air pressure and flow, as shown in FIG. 5E Close to the air turbine 10, the air hose splits into two short Ø6 mm hoses that connect to two Ø6 mm nozzles which supply air evenly to the plastic turbine 10.

An example of the PCB for a 2-element stationary RF receive coil, which sits inside the stationary cylinder 11 for the applications in experiment 2, shown in FIG. 5G. The transceive RF coil 13 and the rotary carrier 14 used for experiments 1 and 3 below is shown in FIG. 5H, whilst the stationary female inductive connector component 28 and rotating male inductive connector component 30 are shown in FIGS. 5I and 5J. FIG. 5K shows the location of the IR photo interrupter 22, which is surrounding the semi-transparent disk 23 and is in proximity of the inductive connectors 28, 30.

The photo-interrupter 22 was connected to the π-filter network on the Faraday cage wall via a 4 m long 3-wire cable 31 (i.e. power, ground and signal) and the output of the π-filter was connected to an amplifier unit. The output of the amplifier was connected to a digital oscilloscope to first confirm the intended frequency of rotation prior to connecting the output of the amplifier unit to the spectrometer 25 for the purpose of sequence triggering application.

The rotating device was then placed into the magnet bore, so that the centre of the cylindrical phantom 5 coincides with the iso-centre of the magnet, commonly referred to as the imaging region. The air was then supplied to the air pressure regulator system, with the first and second regulator set to 65 psi and 16 psi respectively. With these settings, at steady state, the air turbine rotated the RF transceive coil at ~18.4 Hz (i.e. ~1104 rpm). It took less than 1 min to reach this steady frequency of rotation, after which the frequency of rotation did not vary by more than about +/−1.2% over long periods of time. The system has been in frequent use (at over ~1000 rpm) for over six months and no apparent mechanical or electrical deteriorations were found upon disassembling the rotating RF device.

A number of specific experiments will now be described.

Experiment 1

RF Homogeneity and In-Vivo MRI with Rotating Transceive

In this experiment, a Fast Low Angle SHot (FLASH) imaging sequence was selected to obtain an axial image with a slice thickness of 5 mm. The field of view (FOV) for image acquisition was set to 25 cm×25 cm and the matrix size was 256×256. A 3 ms duration Gauss pulse was used to nutate the spins by 45°, while the time of repetition (TR) was 70 ms.

The transceive coil 13 is used to both transmit the RF energy and receive the FIDs (i.e. no pin-diodes are used for switching). The reception of FIDs during RF coil 13 rotation is viable, because the frequency of Larmor precession ($f_0$=85.45 MHz) is much higher than the frequency of rotation (i.e. 18.4 Hz), and so in the reference frame of spins, the coil 13 may be regarded to be almost stationary.

Figure 6:
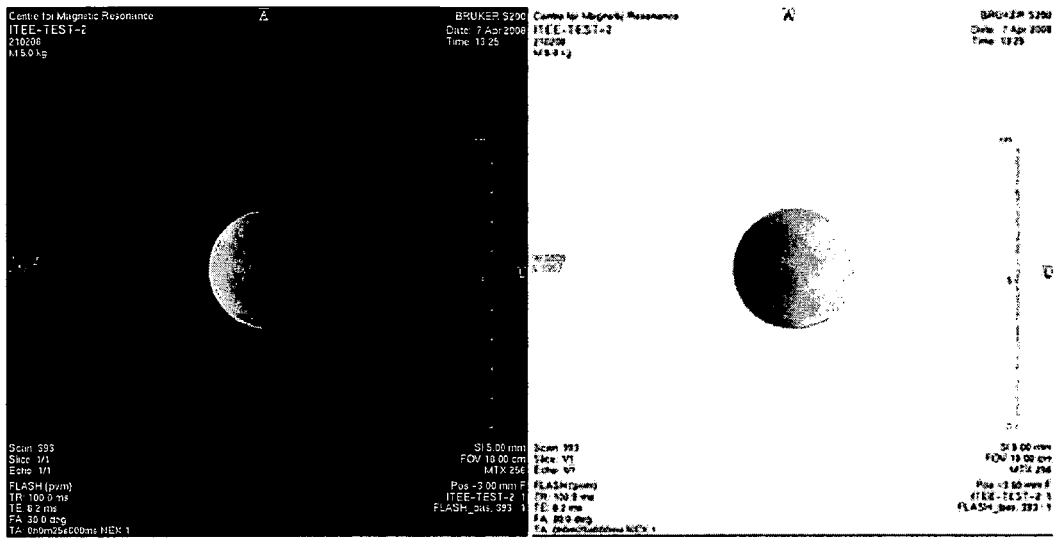
FIG. 6 is a positive and negative axial image of an example RF field produced by a coil fixed at 0° angular position.

FIG. 6 is an axial sensitivity profile and illustrating the profile of the RF field $B_1$ obtained with the described FLASH imaging sequence when the coil is fixed at 0° angular position. The image is shown as both positive and negative images for clarity purposes, and in particular to highlight features that may not otherwise be adequately reproduced. Subsequent images in the specification are also shown in this manner for clarity.

Figure 7:
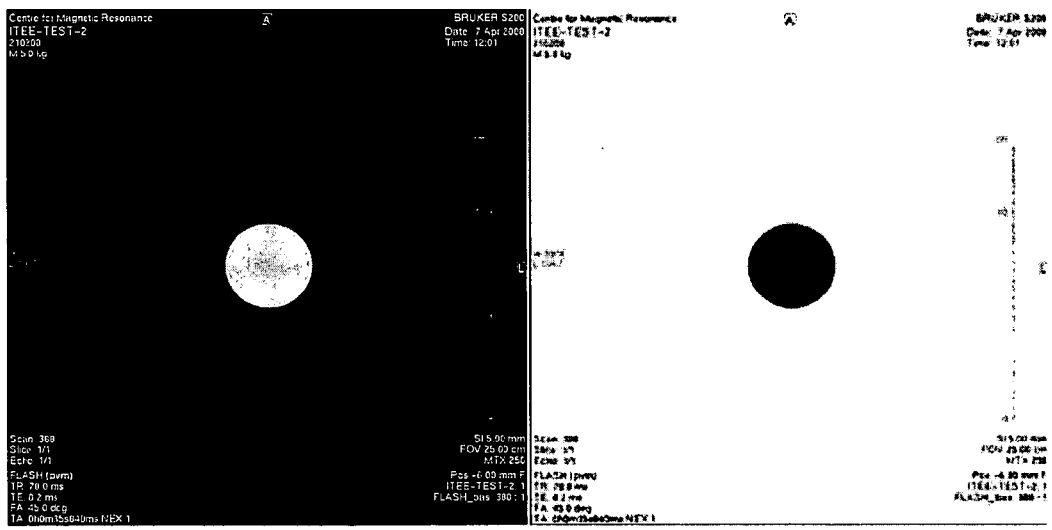
FIG. 7 is a positive and negative axial image of an example RF field produced by a coil rotating at 18.4 Hz.

An equivalent axial sensitivity profile measurement taken when the coil is rotating at 18.4 Hz (i.e. period T=~54.35 ms, and rotation=1104 rpm), is shown in FIG. 7. With the coil 13 in stationary position, an image of only a portion of the sample is successfully acquired, whereas when coil 13 is rotated, the entire sample can be uniformly imaged, with at least 80% of the central part of the sample being illuminated by a uniform RF field $B_1$ that varies by less than +/−5% from the mean value.

More importantly, it is noted that the RF field is quite uniform around the sample periphery as opposed to conventional stationary RF systems, as will be described in more detail below with respect to FIGS. 14A and 14B. It is appreciated that due to such homogenous peripheral field behaviour the rotating RF system is ideal for imaging applications that relate to image segmentation, as it facilitates minimal (or no) bias field corrections in the image processing chain. Furthermore, the monotonic behaviour of the bias field lends this imaging scheme to more computationally efficient bias field correction algorithms.

To substantiate the applicability of the rotating RF scheme, in-vitro imaging was performed on a deceased adolescent laboratory rat in accordance with ethical guidelines. In addition, a chicken drumstick, a kiwi fruit, a passionfruit and a mandarin were also inserted into the moving apparatus 3 and were imaged. For each sample, the transceive coil was retuned and rematched and the experiment was repeated with the coil rotating at 1104 rpm while conditions of experiment 1 were assumed.

In the experiment involving the rat in particular, the coil was rotating at 1260 rpm, the thickness of the selected slice was 3 mm and the FOV was set to 17 cm×17 cm with a matrix size of 256×512. The TR and TE were set to 65.8 ms and 8.2 ms, respectively. The power of the RF pulse train was adjusted to induce a 33° flip angle. The number of averages was set to one, number of echoes was one and a total of ten dummy scans were performed prior to actual imaging. Different slice positions were chosen to investigate the acquired anatomical images.

Figure 8A:
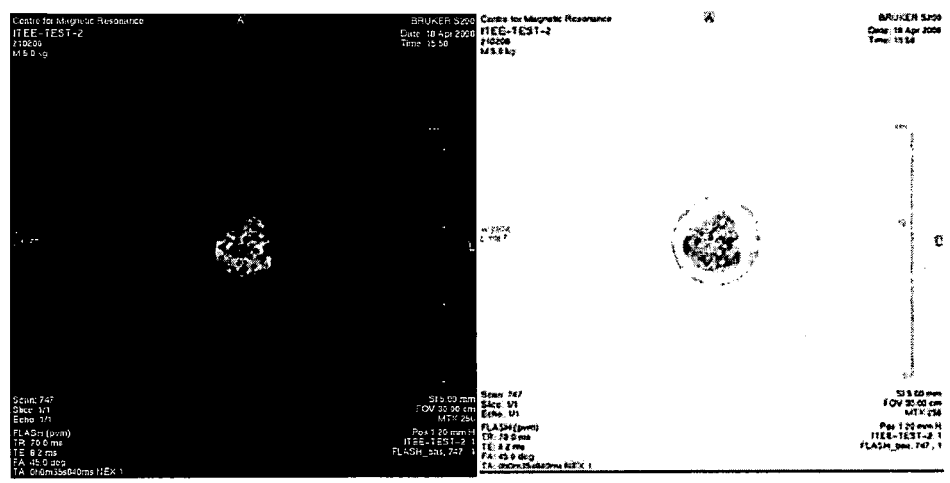
FIG. 8A is an example of a positive and negative axial image of a passion fruit obtained using the RF field of FIG. 7.
Figure 8B:
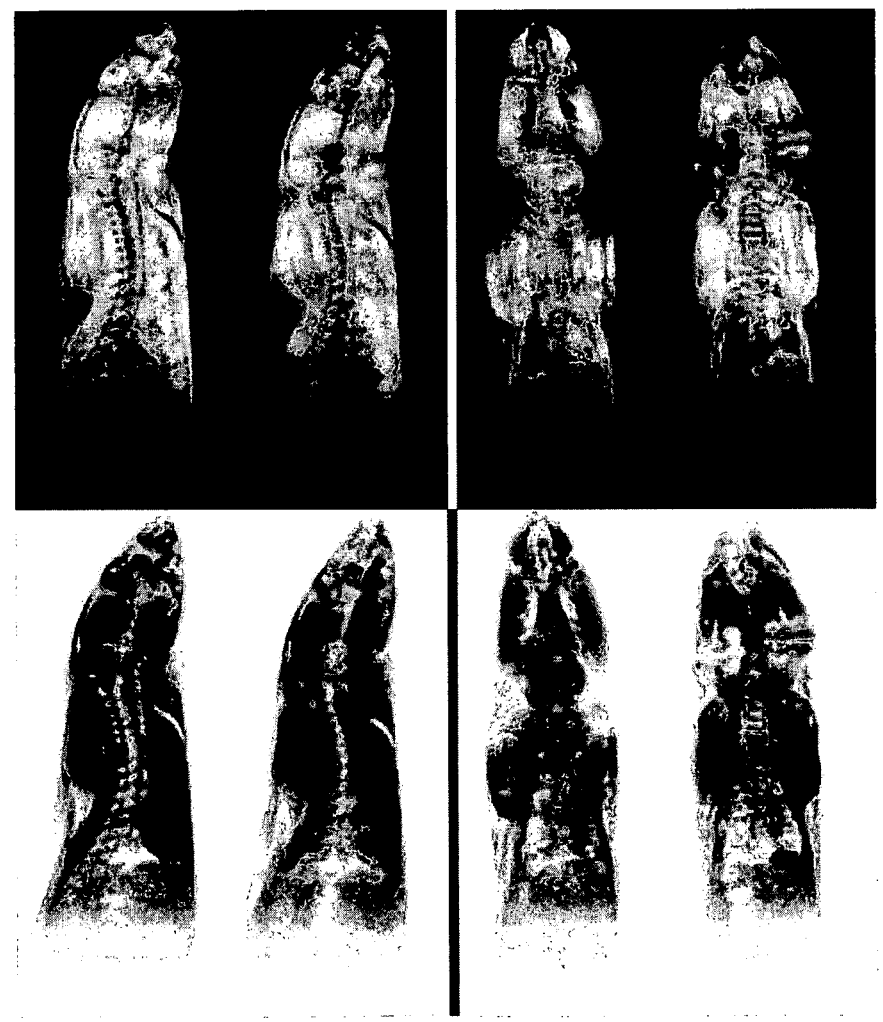
FIG. 8B is an example of different positive and negative sagittal and coronal images of a priori deceased rat.
Figures 9A, 9B, 9C:
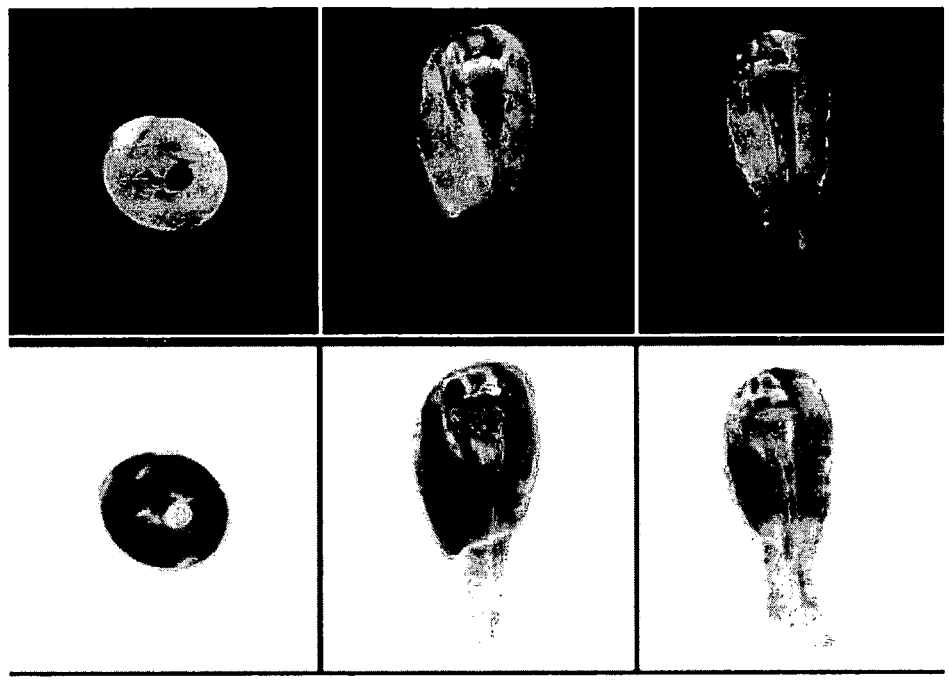
FIGS. 9A to 9C are example axial, sagittal and coronal positive and negative images of a chicken drumstick obtained using the RF field of FIG. 7.
Figures 9D, 9E, 9F:
FIGS. 9D and 9E are example axial and sagittal positive and negative images of a kiwi fruit obtained using the RF field of FIG. 7.
FIG. 9F is an example positive and negative axial image of a kiwi fruit obtained using the RF field of FIG. 7.

FIG. 8A shows an axial image of the passionfruit obtained with a FOV of 30 cm×30 cm. FIG. 8B illustrates different sagittal and coronal images of the rat showing good anatomical details. FIGS. 9A to 9F illustrate several images of a chicken drumstick, a kiwi and a small orange obtained with a similar imaging pulse sequence.

Experiment 2

Field Uniformity with Rotating Transmit and Stationary Receive MR

In this example, instead of receiving the FID or echo signals with the same coil 13, a separate 2-element receive-only phased array coil 12 was constructed, as shown in FIG. 5G above. The receive coils 12 are situated on the outer surface of the fixed cylinder 11. The RF coil 13 on rotating cylinder 14 is rotated and used as transmit-only coil. Fast pin-diode switching systems are included in both coils 13, 12, which effectively open-circuits one coil from another whenever the other coil 13, 12 is in operation.

Figure 10:
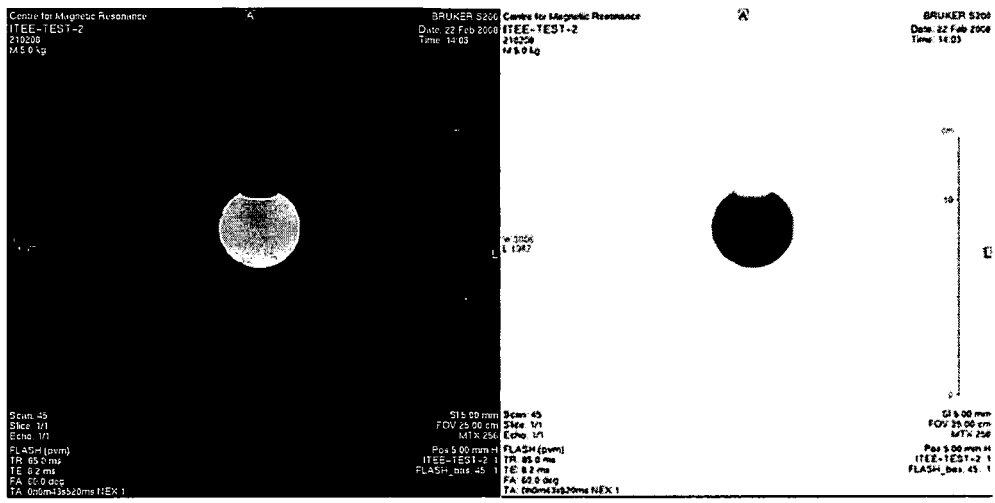
FIG. 10 is an example positive and negative axial image of a cylindrical phantom attained using a two-element receive-only coil during coil rotation at 1104 rpm.

FIG. 10 illustrates the image of the homogenous cylindrical phantom 5 acquired with this setup. In this image, a top part of the cylindrical phantom image appears dark due to the presence of an air bubble. The dark artefacts on the periphery of the cylindrical phantom image are due to plastic holders which were used initially to support the cylindrical phantom inside the sample tube 11. These supports were removed later and the cylindrical phantom was fully filled to attain the uniform image shown in FIG. 7.

Experiment 3

Multi-Dimensional RF Pulses with Rotating Transceive MR

Figure 11:
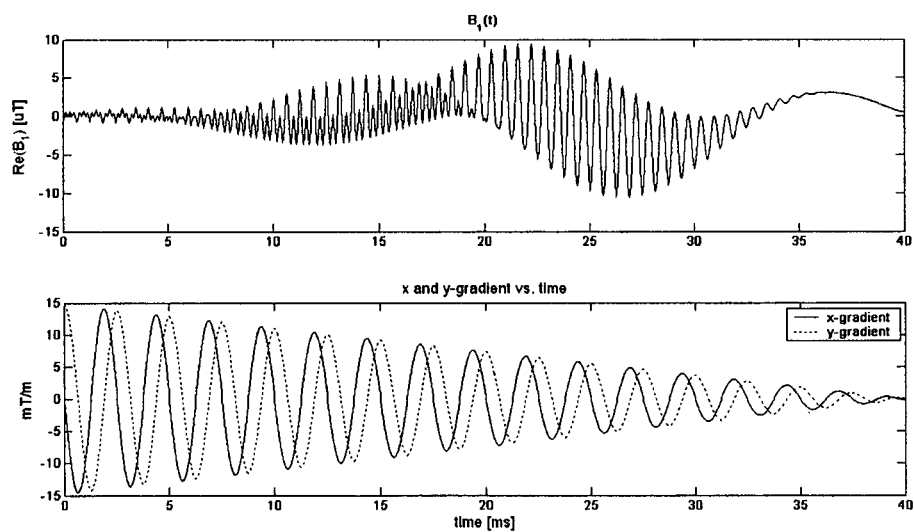
FIG. 11 is a graph of example of multi-dimensional RF pulses and accompanying gradient waveforms for the selected axial excitation of four Gauss shapes.

For spatially selective magnetization excitation of four Gauss shapes, the multi-dimensional RF pulses and gradient field waveforms were computed assuming a uniform profile for the RF field $B_1$, as shown in FIG. 11.

A Multi-Spin Multi-Echo (MSME) imaging pulse sequence was selected, with the RF pulse train being transmitted during a time period of 40 ms while applying transverse gradients as shown in FIG. 11. While this excites a volume of spins, the slice position was selected during the application of the 180° refocusing RF pulse, thereafter, frequency and phase encoding was performed. The thickness of the selected slice was chosen to be 5 mm, while the FOV was set to 22 cm×22 cm with a matrix size of 256×256.

The RF coil 13 operating in transceive mode and rotating at ~1000 rpm was engaged in this experiment. Note that the receive-only phased array coil 12 is removed. The TR and TE were set to 80.2 ms and 38.5 ms, respectively. The power of the RF pulse train was adjusted to induce a 60° flip angle.

Figure 12A:
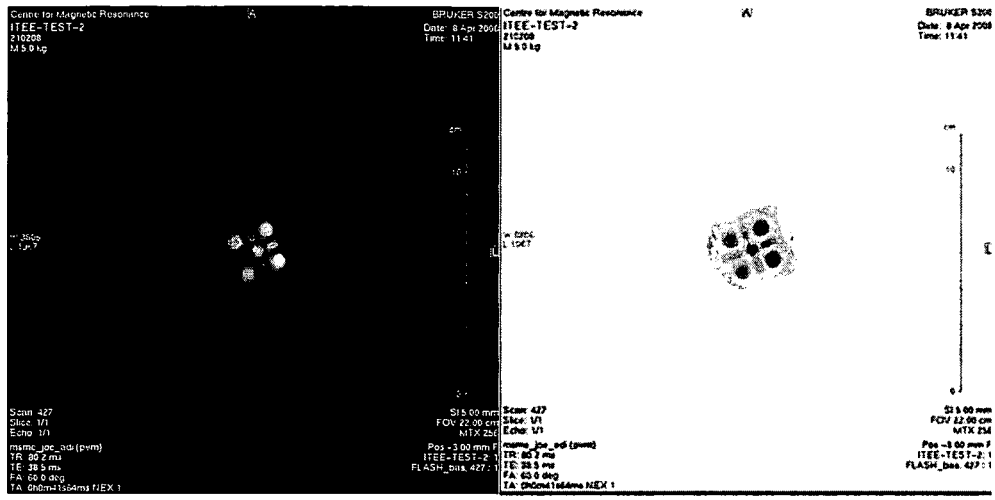
FIGS. 12A and 12B are positive and negative axial images of examples of selected excitation of four Gauss shapes by the pulses of FIG. 11, for single and double experiments, respectively.
Figure 12B:
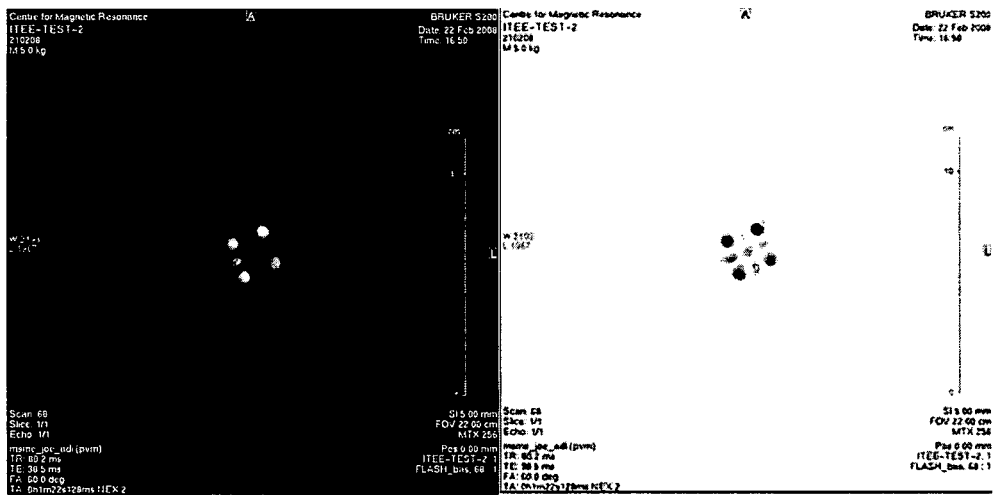

The image in FIGS. 12A and 12B shows that rotating a single coil in transceive mode can excite the target excitation pattern and receive the resulting echo signals as the spins rephase. The images in FIGS. 12A and 12B were obtained with NEX=1 and NEX=2 respectively (here: NEX=number of averages).

It will be appreciated that a number of other applications of the moving coil arrangement can be implemented. Examples of these will now be described, although these examples are not intended to be limiting.

Furthermore, no evident Lorentz forces or effects of other eddy current forces/torques due to the moving conducting coil and pulse RF current in the static magnetic and gradient pulsed fields were observed during all nominated experiments. This observation is confirmed by very stable square-shaped waveforms from the rotating coil on the digital oscilloscope and by direct visual observation of the rotating coil as the experiments were conducted. It is believed that these forces are very small because the entire coil is situated in a uniform static magnetic field in absence from static field gradients and because the RF conductors are reasonably small in area to result in significant eddy current induction due to pulsed gradient coils.

Rotating Sensitivity Encoding

The rotating MRI concept can be used in transmit and receive Sensitivity Encoding (SENSE) applications. In contrast to standard parallel architectures, where the coil elements are physically stationary, the coil moving apparatus involves an azimuthal rotation of the coil (array) (or motion in general) whilst transmitting the desired RF field $B_1$ waveform(s) or receiving a series of FIDs/echoes.

Through the introduction of physical rotation (or motion in general) as additional degree of freedom in the system construct, an arbitrary number of virtual stationary coils and sensitivity profiles, can be realised. This can enable a significant reduction of RF transmission and reception time periods and thus the overall imaging time as the use of gradients diminishes. Proportionally this also increases the reduction of deleterious effects arising from switching of the gradient coils. In addition, the coil moving apparatus necessitates only one or fewer channels to effectively imitate a parallel transceive coil array consisting of C number of coils/channels (C>>1), which practically may not be feasible with stationary coil arrangements. As conventional parallel arrays can suffer from mutual coupling effects, their associated hardware channels are frequently affected by signal delays that require proper synchronization. It is therefore appreciated that the single rotating transceive coil does not experience RF phase shifts.

Conceptually, in the limit of increasing the number of sensitivity profiles and thus channels for a given matrix size (say 256×256 MR image) using the moving transceive system, the usage of gradient coils in excitation or acquisition of k-space converges to a single point located in the centre of the k-space, which in effect corresponds to the case when gradient fields are not applied at all (i.e. only $B_0$ is present). This essentially means that all encoding can be performed with sensitivity patterns alone while gradients are switched off. In this extreme conceptual case, the reduction of the scan time is significant.

In one example, a method is presented that includes a step of determining the progress of spatial sensitivity pattern(s) during the system rotation.

The method further includes the step of determining the required transmit RF field pulse(s) $B_1$ for the excitation of the target excitation profile and the manner in which the attained RF field waveform(s) $B_1$ is/are transmitted during the rotation(s) of the transceive coil 13.

Rotating Transmit SENSE

The following passages describe and exemplify the concept of rotating transmit SENSE.

Under the assumption of the small tip angle approximation, an arbitrary transverse magnetization excitation pattern $M_{target}(x)$ can be approximated by the Fourier integral of an excitation k-space trajectory $k(t)=[k_x(t), k_y(t), k_z(t)]$ traced by the gradient coils, temporally weighted by a complex RF pulse $b_1(t)$ and spatially weighted by the coil's complex sensitivity pattern $S(x)$. The variable x denotes the spatial coordinate vector and t the time coordinate.

$$M_{target}(x) = i\gamma M_0 S(x) \int_0^T b(t) e^{i\gamma\Delta B_0(x)(t-T)} e^{ix \cdot k(t)} dt \quad \text{Eq. 1}$$

where i is the complex number, γ is the gyromagnetic ratio, $M_0$ is the equilibrium magnetization magnitude, T is the pulse length and the first exponential term denotes the phase accrued due to the main field inhomogeneity defined by the field map $\Delta B_0(x)$.

For a pulse duration from t=0 to t=T, the k-space trajectory is defined by the time-reversed integration of the gradient trajectory G(t) via:

$$k(t) = -\gamma \int_t^T G(\tau) d\tau \quad \text{Eq. 2}$$

If C is the number of transmit coils with known, arbitrary, complex sensitivity patterns $S_c(x)$, c=1 . . . C, each having a pulse profile $M_c(x)$ within the excitation $FOV_e$, the excitation pattern $M_{target}(x)$ of arbitrary shape can be decomposed via:

$$M_{target}(x) = \sum_{c=1}^{C} S_c(x) M_c(x) \quad \text{Eq. 3}$$

Owing to the linearity of Eq.3, spatial superposition of all the individual pulse profiles $M_c(x)$, weighted by the corresponding sensitivity distribution $S_c(x)$, yields the desired aggregate excitation pattern $M_{target}(x)$ which can be written in the following integral form:

$$M_{target}(x) = i\gamma M_0 \sum_{c=1}^{C} S_c(x) \int_0^T b_c(t) e^{i\gamma\Delta B_0(x)(t-T)} e^{ix \cdot k(t)} dt \quad \text{Eq. 4}$$

where $b_c(t)$ denotes the unique complex RF pulse of coil c. Here, the central idea of the original transmit-SENSE concept is to determine the RF waveforms $b_c(t)$ for the C transmit coils.

As next, the spatial coordinate vector x is discretized into an N×N matrix while spanning the excitation field of view ($FOV_e$). The matrix x can then be expressed in form of vector $x_p$, with $p=N^2$ elements. In addition, time is discretized into p-samples. Now, the R-fold reduction of the excitation k-space trajectory k(t) is equivalent to an R-fold reduction of the RF pulse duration. This temporal reduction can be expressed as q=p/R. It is noted that the reduction factor R does not need to be equal to the number of coils C employed in the hardware construct. Eq.4 may then be written as:

$$M_{target}(p) = \sum_{c=1}^{C} D_c(p, p) P(p, q) b_c(q) \quad \text{Eq. 5}$$

where $D_c = \text{diag}\{S_c(x_p)\}$ is a p×p diagonal matrix containing samples of the complex sensitivity pattern of coil c, $b_c$ is a length-q vector of RF pulse samples for coil c and the (i, j)-th element of the p×q system matrix P is written:

$$P_{i,j} = i\gamma\Delta t M_0 e^{i\gamma\Delta B_0(x_i)(t_j-T)} e^{ix_i \cdot k(t_j)} \quad \text{Eq. 6}$$

Horizontal and vertical concatenation of matrices $D_c P$ and vectors $b_c$, respectively, yields the following matrix system:

$$M_{target}(p) = [D_1(p, p)P(p, q) \ldots D_C(p, p)P(p, q)] \times \begin{bmatrix} b_1(q) \\ \ldots \\ b_C(q) \end{bmatrix} \quad \text{Eq. 7}$$

$$= P_{full}(p, q) b_{full}(q)$$

or simply: $M_{target} = P_{full} b_{full}$

The unknown vector $b_{full}$ contains all requested $b_c(t)$ waveforms in a discretized form of length-q for all C coils as a function of the reduced k-space trajectory. It can be solved by a straightforward matrix inversion, iterative procedures or for ill-conditioned systems with the help of regularization techniques, among others. Regularization can be useful in controlling the peak and integrated RF power. The following regularization may be employed:

$$b_{full} = P^*_{full}(P_{full} P^*_{full} + \beta^2)^{-1} M_{target} \quad \text{Eq.8}$$

where * represents the transposed complex conjugate and β is a freely adjustable regularization parameter. Transmitting the derived waveforms simultaneously via the corresponding physically stationary coils excites the desired pattern $M_{target}(x)$.

A further example will now be described that involves physically rotating a coil (array) and hence the associated sensitivity map(s) to emulate spatially adjacent sensitivity patterns of virtual stationary coils over time. From the theoretical/computational point of view, let the total number of rotating coils $C_{rot}$ positioned on a cylinder be one (i.e. $C_{rot}=1$) and the experimentally measured complex sensitivity of the assumed coil $c_1$ be given by:

$$S_1(x)=S_{1,x}(x)+iS_{1,y}(x) \qquad \text{Eq.9}$$

where x is an N×N matrix that covers the desired excitation $FOV_e$. Both the real and imaginary component of the discrete sensitivity map $S_1$, associated with the single rotating coil $c_1$, is revolved c-times axially through the incremental angle $\alpha=2\pi c/C$ to emulate C-number of virtual, stationary sensitivity maps over time, assuming that the rotary carrier 14 is rotationally iso-centric. The rotation of the N×N matrices $S_{1,x}$ and $S_{1,y}$, can easily be accomplished with any of the well-known image rotation algorithms, such as rotation by shear or rotation by area mapping. For instance, the matrix transform for rotation can be approximated by three sequential shear operations:

$$R_\alpha^T = Q_{y,a} \cdot Q_{x,b} \cdot Q_{y,a} = \begin{pmatrix} 1 & a \\ 0 & 1 \end{pmatrix}\begin{pmatrix} 1 & 0 \\ b & 1 \end{pmatrix}\begin{pmatrix} 1 & a \\ 0 & 1 \end{pmatrix} \qquad \text{Eq. 10}$$

Choosing $$a = -\tan\left(\frac{\alpha}{2}\right)$$

and $b=\sin(\alpha)$, yields:

$$R_\alpha^T = \begin{pmatrix} 1 & -\tan\left(\frac{\alpha}{2}\right) \\ 0 & 1 \end{pmatrix}\begin{pmatrix} 1 & 0 \\ \sin(\alpha) & 1 \end{pmatrix}\begin{pmatrix} 1 & -\tan\left(\frac{\alpha}{2}\right) \\ 0 & 1 \end{pmatrix} \qquad \text{Eq. 11}$$

$$= \begin{pmatrix} \cos(\alpha) & -\sin(\alpha) \\ \sin(\alpha) & \cos(\alpha) \end{pmatrix}$$

Application of the $R_\alpha^T$ operator to the sensitivity components $S_{1,x}$ or $S_{1,y}$ results in the anticlockwise rotation of that component maps by angle $\alpha$:

$$S_\alpha = R_\alpha^T S_{1,\xi} \qquad \text{Eq.12}$$

where $\alpha=2\pi c/C$ and $\xi=\{x, y\}$. It is noted the resulting rotated sensitivity matrices $S_\alpha$ must be of equal size as the original matrix, i.e. N×N.

If the RF coil carrying cylinder 14 is not perfectly rotationally isocentric, in an attempt to obtain accurate complex sensitivity maps, the RF coil can be rotated to a position of interest and the complex sensitivity map can be measured or imaged at a number of angular positions equally spaced over the full 360° interval. For instance, one could measure 32 sensitivity profiles in increments of (360°/32) followed by interpolation of in-between sensitivities with aid of Eq.12 or like. This approach may lessen the amount of measurements required for the intended number of imitated sensitivities.

It should however be realised that transmitting and receiving with the same coil will generate a spatial RF profile in the square sense and this is not the pure transmit-only sensitivity pattern. To obtain the transmit-only sensitivity profile, the process is not straightforward as taking the square root of the acquired image as the receive-only profile with which the data was acquired is not uniform over the full spatial extent of the phantom. Traditional approaches therefore often rely on a homogeneous RF reference map obtained by using a whole-body receiver coil, wherein the transmitting coil is pulsed in transmit-only mode. Therein, the obtained images are normally divided by this homogeneous reference map to isolate the transmit-only sensitivity profile. A number of transmit-only sensitivity map measurement techniques exist.

Herein, relating to the rotating coil concept, a new measurement technique involving pulse sequence triggering, is briefly described. In order to obtain a number of transmit-only sensitivity profiles for a number of angular coil positions without manually fixing the coil, it is possible to trigger the acquisition so that the repetition time (TR) and coil revolution time (T) are made equal (i.e.TR=T). If the excitation pulse (preferably a 90° gauss or sinc pulse) is transmitted during a very short time period such as ~80 µs-1 ms, there will be minimal spatial diffusion of magnetization excitation and the transmit-only spatial pattern will be proper and well-behaved. That is, the transmit-only sensitivity map should be almost identical to one obtained assuming a fixed transmitter coil.

Provided that $T_2$ time constant of the homogeneous sample is quite long (such as that of distilled water), then the acquisition of the free-induction decay signal during one k-space line encode that occurs within one full period of revolution of the rotating coil will be uniformly weighted by the receiving sensitivity map in the frequency domain. Once all k-space lines in the phase-encoding direction are obtained, the overall receive-only sensitivity pattern in image space will be quite uniform while the correct yet scaled transmit-only sensitivity pattern will be directly obtained upon image reception. This procedure can be repeated for triggering a similar sequence for an angularly offset coil position, which in effect will yield another sensitivity map. To isolate pure and non-scaled transmit-only sensitivity maps from the acquired images, each image can be divided by the sum of squares of all attained images (i.e. sensitivity profiles).

Rotating Transmit SENSE vs. Traditional Transmit SENSE

In contrast to the original transmit SENSE concept, where unique RF waveforms $b_c(t)$ are transmitted in synchrony on the corresponding physically stationary coils while applying gradients, it is sensible to rotate a single coil ($C_{rot}=1$) and therefore its sensitivity distribution $S_1$, while transmitting the intended RF pulse waveform samples $b_{full}$ over time in correspondence with the angular position of the coil sensitivity map.

For each k-space gradient trajectory point (k-GTP), the coil requires one full revolution during which RF waveform samples are transmitted in series while temporally interspaced depending on the number of intended sensitivities and angular frequency of the coil rotation. It follows that for a number K of k-GTPs, the RF coil needs to undergo K rotations, whereby during each rotation $b_{full}/K$ RF samples are transmitted serially. Therefore the transmit time of the $b_{full}/K$ samples set in the MR pulse program should be equal to the period of one mechanical coil rotation.

For example, in the scheme of conventional transmit SENSE involving six transmit channels, for each k-GTP, one RF sample is transmitted by each transmit channel, hence a total of six unique RF samples per k-GTP are played out in parallel at a certain point in time.

However, in the rotating transmit SENSE, the same six RF samples are transmitted in series during one coil revolution for each k-GTP, whereby the six corresponding sensitivity maps are interspaced by (360/6)°.

This is highlighted by FIGS. 13A and 13B. In this regard, FIG. 13A shows serial transmission of $b_{full}/K$ RF samples with a single coil during a full 360° coil rotation. One coil revolution corresponds to a single k-space point encoded by the gradient fields. For number K of k-space points, a total of K revolutions are required. In contrast FIG. 13B shows serio-parallel transmission of $b_{full}/K$ RF samples with an array of C coils (each with a dedicated channel) during one coil rotation. For number K of k-space points, a total of K/C revolutions need to be performed. For illustration purposes C is set here to 6.

It is appreciated that other schemes of rotational signal transmission and reception can be implemented and engaged to achieve particular imaging modalities or measurements.

In order to excite the target spins and start acquiring the FIDs/echoes promptly, the overall RF pulse length must be pertinently shorter than the exponential time decay of the RF signals received. This imposes modest revolution per minute (rpm) requirements on the described rotating apparatus. For instance, 50 ms RF transmit time per revolution corresponds to 1200 rpm, which is easily realisable with modern machinery.

The power of the rotating transmit SENSE concept lies in the fact that rotating a single (or fewer) coils can significantly increase the number of desired sensitivities. More importantly, the number of k-GTPs and the total number of required coil revolutions decreases proportionally. As the number of k-GTPs decreases, so does the time length of the temporal gradient pulses. This leads to larger reduction factors R and considerably decreases transmit and overall scan time.

However, for large values of reduction factor R and imitated channels C, the limit on the minimum overall RF pulse length is related to the ability of the RF synthesizer unit to transmit the RF samples in an adequately short time frame. Modern signal generation units are capable of temporal resolutions in the order of ~25 ns. In extreme case, serial imitation of ~400,000 stationary channels C within a transmit time period T of only 10 ms (i.e. 6,000 rpm) would be feasible. This is equivalent to an almost two-fold oversampled excitation $FOV_e$ of size 512×512 with no application of gradient trajectories. Also, for a proper transmission of a large number of RF samples, the rpm-variation over time should be as small as possible/practical.

Nevertheless, in the rotating transmit SENSE concept, one (or fewer) channels can perform the job of many channels. This can reduce system complexity and overall cost.

It will also be appreciated that once the moving apparatus is established, any transmit, receive or transceive RF coil architecture can be implemented and simply attached to the rotating shaft of the above described apparatus and revolved.

In order to decrease the number of required RF coil revolution per one k-GTP, a small array of mutually decoupled transmit coils $C_{rot}$ can be implemented, where each coil is linked to one hardware channel. As the array undergoes a mechanical rotation, all $C_{rot}$ channels transmit one RF sample in synchrony at a certain time point and then advance to a new angular position to transmit other $C_{rot}$ RF samples in parallel. This hybrid serio-parallel transmit rotating SENSE (SEP-TRO-SENSE) mode effectively reduces the total number of required revolutions by a factor of $C_{rot}$, as the transmit channels share the allocated workload.

For a given overall transmit time, the speed of system rotation (in rpm) may be reduced by the same factor $C_{rot}$ to yield an equivalent result. Also compared to the traditional transmit-SENSE, the SEPTRO-SENSE method can allow for larger reductions in transmission time, while reducing the number of hardware elements and the error in excitation of target magnetization. The presented concepts may also be formulated in the frequency domain.

The Rotating SENSE concept can find a number of applications in the scope of high and ultra-high field MR technology. Furthermore, the serial and serio-parallel transmission mode may be used to decrease the Specific Absorption Rate (SAR) encountered when RF energy interacts with the patient, thus minimizing the damage to living tissue at high frequencies.

The fundamental mathematics of Eqs.1-8 is unaltered in view of the coil moving apparatus. For instance, if the $FOV_e$ is discretized into an N×N matrix, the number of vector elements is $p=N^2$. Employing a single rotating coil to imitate $C \geq p$ stationary coils, any reduction factor $R \leq p$ can be then chosen to shorten the k-space trajectory while facilitating minimal target pattern reconstruction errors $\delta M_{target}(x)$. For values of $C \leq p$ and $R = p$, the reconstruction error increases, as the excitation $FOV_e$ is under-sampled/aliased. In the case that $R = p$, the k-space trajectory sample length is $q = p/R = p/p = 1$. If this single point is chosen to be at the origin of the k-space, the excitation problem is simplified as it corresponds to a situation when the excitation encoding gradients are turned off.

In contrast, it would naturally require $C \geq p$ of stationary channels and $R = p$ to achieve the same condition. For instance, assuming a modest $FOV_e = 32 \times 32$, the number of required stationary coils would reach up to 1024, or more. Clearly, this would impose significant mutual coupling issues, a large number of lumped circuit components and amplifiers in the dedicated channels. In the case that $R < p$, the application of encoding field gradients is clearly required. However, with the field gradients turned off ($R = p$, $C \geq p$), the total transmit time is not bound by the maximum slew rate of the gradient set. Instead it depends only on the maximum allowable angular velocity of the rotating apparatus and the temporal resolution of the signal generating unit/amplifier chain.

Rotating Receive SENSE

The concept of traditional receive and transmit SENSE can be thought to be the reciprocals of each other. In the previous section the principles of rotating transmit SENSE were described and discussed. Similar ideas can be applied to the concept of rotating receive SENSE, where a receiver coil (or small array) undergoing a rotation is able to emulate a large number of sensitivity distributions, which in effect aids in sampling compensation of k-space that is under-sampled by frequency and phase encoding gradients. This allows for a scan time reduction whereby only one or fewer physical channels are available. This can ultimately improve fast dynamic MR imaging such as those of human and rodent hearts.

The following passages describe and exemplify the concept of rotating receive SENSE.

Looking at the time scales in the nuclear spin—rotating RF coil system, the frequency of both the RF transmission field and the resonating $^1H$ nuclear spin (i.e. tens to hundreds of MHz) is, for most practical purposes, six orders of magnitude larger than the rotational frequency of the RF coil (i.e. tens to hundreds of Hz). Therefore, in the temporal frame of reference of the RF transmission field and the nuclear spin, the rotating RF coil can be perceived as 'physically stationary' while the spins are excited and the MR signal is induced in the RF coil. At the same time as the net magnetization is tipped into the transverse plane or the MR signal decays exponentially due to $T_1$ and $T_2$ relaxation phenomena, the fast rotating coil may over time be perceived as multiple stationary coils analogous to a conventional N-element RF (transceive or receive) coil array. In other words, a rotating RF coil emulates an N-element RF coil array in a fashion akin to time division multiplexing (TDM) used in digital communication theory. Therefore, the algorithm or method that implements rotating receive SENSE can be called: Time-Division-Multiplexed Sensitivity Encoding (TDM-SENSE).

In one example, consider a single RF transceive coil on a cylindrical surface that encloses the imaged object. The axis of the coil-carrying cylinder is assumed to be parallel to the z-axis of the main magnet, so that the RF field produced by the coil is orthogonal to the direction of the $B_0$ field. Furthermore, it can be assumed that at time t=0 the coil is positioned on the cylinder at a known initial angle $\theta_0$ within the laboratory frame of reference. The RF coil may then be characterized by a complex spatial sensitivity map $s(r_0)$, where $r_0=(x_0,y_0,z_0)^T$ is the position vector in the spatial domain defining the initial coordinates of the coil sensitivity.

If the RF coil is rotated about the imaged object at a constant angular frequency, $\omega_c$, a set of rotated sensitivity maps $s(r(\theta_0))$ is produced at angles $\theta_c=\omega_c t+\theta_0$ in a continuous time-sequential fashion, where $r=R(\theta_c)r_0$ denotes the rotated coordinates:

$$r(\theta_c) = r(\omega_c t + \theta_0) \quad \text{Eq. 13}$$

$$= R(\theta_c)r_0$$

$$= e^{i\theta_c}\begin{pmatrix} \cos(\theta_c) & \sin(\theta_c) & 0 \\ -\sin(\theta_c) & \cos(\theta_c) & 0 \\ 0 & 0 & 1 \end{pmatrix}\begin{pmatrix} x_0 \\ y_0 \\ z_0 \end{pmatrix}$$

where $\partial\omega_c/\partial t=0$, while in general, the angular frequency may itself be time-variant: $\omega_c(t)$.

When the rotating RF transceive coil is used to excite the spin system, a complex RF transmission pulse $b_1(t)$ modulates $s(r(\omega_c t+\theta_0))$ to bring the initial net magnetization $m_0(r)$ towards the transverse plane:

$$m(r) = i\gamma \int_0^{T_b} b_1(t)s(r(\omega_c t + \theta_0))m_0(r)e^{-2\pi i k(t)\cdot r} dt \quad \text{Eq. 14}$$

$$k(t) = \frac{\gamma}{2\pi}\int g(\tau)d\tau \quad \text{Eq. 15}$$

where:
- m(r) is the accumulated initial transverse magnetization distribution,
- $r=(x,y,z)^T$ represents the spatial position vector,
- γ is the gyromagnetic ratio of the nuclear spin,
- $T_b$ denotes the duration of the $b_1(t)$ pulse,
- k(t) is an arbitrary k-space trajectory obtained by pulsing magnetic field gradients $g=(g_x,g_y,g_z)^T$, and
- τ is a dummy constant of integration.

Eq.14 is a generic form of spatially selective excitation of magnetization distribution $m_0(r)$ (i.e. spin density) achieved with the multi-dimensional RF pulse, $b_1(t)$, under guidance of the k-space trajectory, k(t). A special form of Eq.14 is a homogenous magnetization excitation at the end of the excitation period $T_b$, which can for instance be obtained by setting k(t)=0 and $\omega_c=2\pi n/T_b$ (where n is an integer and n>1).

Following the spin excitation, the rotating RF transceive coil can be used to receive the demodulated time-varying MR signal b(t) that emanates from the spins in the object:

$$b(t) = \int_{-\infty(r)}^{\infty} s(r(\omega_c t + \theta_0))m(r,t)e^{-2\pi i k(t)\cdot r} dr \quad \text{Eq. 16}$$

$$m(r,t) = m_0(r)e^{-\frac{t}{T_2^*}}\left(1 - 2e^{-\frac{2TR-t}{2T_1}} + e^{-\frac{TR}{T_1}}\right) \quad \text{Eq. 17}$$

Where:
- m(r,t) represents the time-dependent magnetization at r for a conventional gradient echo sequence,
- $T_1$ and $T_2^*$ are the tissue-dependent longitudinal and transverse relaxation times that are implicit functions of r and define the contrast in the image.

TR is the time between pulse sequences. In practice, it is often desirable to minimize the off-resonance and susceptibility effects. The acquisition time period $T_{acq}$ of the echo is then made very short (in the order of few milliseconds), so that $T_{acq} \ll T_2 \ll T_1$ and thus m(r,t)→m(r).

For a better understanding of the image acquisition with the rotating RF (transceive or receive) coil, Eq.14 and Eq.16 can be written in discrete forms to comply with the digital instrumentation of the MRI system:

$$m(r_q) = i\gamma\sum_{p=1}^{P} b_1(t_p)s(r(\omega_c t_p)_q)m_0(r_q)e^{-2\pi i k(t_p)\cdot r_q}\Delta t_{trans} \quad \text{Eq. 18}$$

$$b(t_j) = \sum_{q=1}^{Q} s(r(\omega_c t_j)_q)m(r_q)e^{-2\pi i k(t_j)\cdot r_q}\Delta t_{acq} \quad \text{Eq. 19}$$

where it is assumed that $\theta_0=0$ and $r(\omega_c t)$ is given by Eq.13. Eq. 18 and Eq.19 describe the formation of excited magnetization $m(r_q)$ and MR data sample $b(t_j)$ using discrete sampling in spatial, $r_q(1 \ldots Q)$, and temporal domain, $(t_j(1 \ldots J), t_p(1 \ldots P))$, where p, q and j are indices in time, 3-dimensional space and spatial frequency domain (k-space), respectively.

To illustrate this in a simple example, we can assume that an axial slice has been selectively excited, so that Q=N×M and J=U×V, where (N,M) and (U,V) are the discrete dimensions of the 2-dimensional image and k-space, respectively. P denotes the total number of discrete samples in the $b_1$ transmission pulse. The arguments $t_p$ and $t_j$ are given by:

$$t_p=p(\Delta t_{trans}) \text{ and } t_j=j(\Delta t_{acp}) \quad \text{Eq.20}$$

where $\Delta t_{trans}=1/f_{trans}$ and $\Delta t_{acq}=1/f_{acq}$ denote the dwell times in the digital transmit and receive chain (i.e. $f_{trans}$ and $f_{acq}$ are the respective frequencies of the digital-to-analogue (DAC) and analogue-to-digital (ADC) converter).

The entire sequence of spatial and k-space domain samples (Eq.18 and Eq.19) can be conveniently stored in measurement vectors, $m_{full}=(m(r_1) \ldots m(r_Q))^T$ and $b_{full}=(b(t_1) \ldots b(t_J))^T$ so that the magnetization excitation and signal formation can be expressed in matrix forms:

$$\begin{pmatrix} m(r_1) \\ \vdots \\ m(r_Q) \end{pmatrix} = \begin{pmatrix} b_1(t_1)s(r(\omega_c t_1)_1)e^{-2\pi i k(t_1)\cdot r_1} & \ldots & b_1(t_1)s(r(\omega_c t_1)_Q)e^{-2\pi i k(t_1)\cdot r_Q} \\ \vdots & \ddots & \vdots \\ b_1(t_P)s(r(\omega_c t_P)_1)e^{-2\pi i k(t_P)\cdot r_1} & \ldots & b_1(t_P)s(r(\omega_c t_P)_Q)e^{-2\pi i k(t_P)\cdot r_Q} \end{pmatrix} \quad \text{Eq. 21}$$

$$\begin{pmatrix} m_0(r_1) \\ \vdots \\ m_0(r_Q) \end{pmatrix}$$

$$= m_{full}$$

$$= Am_{full,0}$$

-continued $$\begin{pmatrix} b(t_1) \\ \vdots \\ b(t_J) \end{pmatrix} = \begin{pmatrix} s(r(\omega_c t_1)_1)e^{-2\pi i k(t_1)\cdot r_1} & \cdots & s(r(\omega_c t_1)_Q)e^{-2\pi i k(t_1)\cdot r_Q} \\ \vdots & \ddots & \vdots \\ s(r(\omega_c t_J)_1)e^{-2\pi i k(t_J)\cdot r_1} & \cdots & s(r(\omega_c t_J)_Q)e^{-2\pi i k(t_J)\cdot r_Q} \end{pmatrix} \begin{pmatrix} m(r_1) \\ \vdots \\ m(r_Q) \end{pmatrix} \quad \text{Eq. 22}$$

$$= b_{full}$$

$$= Bm_{full}$$

It follows that:

$$b_{full} = BAm_{full,0} = Em_{full,0} \quad \text{Eq. 23}$$

Where
$m^{full,0} = (m_0(r_1) \ldots m_0(r_Q))^T$ is the spatial signal distribution, representing the imaged object; $k(t_p) = [k_x(t_p), k_y(t_p)]^T|_{p=1\ldots P}$ and
$k(t_j) = [k_x(t_j), k_y(t_j)]^T|_{j=1\ldots J}$ denote the k-space trajectories during transmission and reception respectively,
$r = [r_{x,q}, r_{y,q}]^T|_{q=1\ldots Q}$ and $r_q(\omega_c t_j) = [r_{x,q}(\omega_c t_j), r_{y,q}(\omega_c t_j)]^T|_{q=1\ldots Q, j=1\ldots J}$ are the time-invariant and time-variant position vectors.

Image contrast is achieved in the usual manner of varying the time of echo (TE) and time of repetition (TR) in the imaging experiment.

In Eq.21 and 22, A and B represent the excitation and encoding matrices, where every matrix element is uniquely modulated by the rotated sensitivity map value on a spatial point to point basis. In an imaging sequence, the population of A and B can be conducted in a time interleaved fashion or any other arbitrary order. Eq.23 is a complete description of the excitation and MR signal acquisition process, as the RF transceive coil is revolving about the imaged objected at a constant angular frequency, $\omega_c$. In Eq.23, E is the composite encoding matrix and contains both transmission and reception type image encoding modulations (i.e. E=AB). The rotation of an RF coil forms a useful parameter in the MR image encoding process in that distributed coil arrays are emulated in a time-division-multiplexed (TDM) fashion. This effectively leads to the generation of a multitude of sensitivity-based degrees of freedom as implicit function of time. The algorithm is therefore defined as Time Division Multiplexed Sensitivity Encoding (TDM-SENSE).

According to the Projection Slice Theorem (PST), time-variant phase modulation of spatial frequency data, as is the case with the rotating/moving electromagnetic element approach, will inevitably result in Nyquist ghosts after the application of a 2-dimensional Discrete Inverse Fourier Transform (2D-DIFT) on $(b_{full})_{U\times V}$ to yield the MR image. For instance, given a sequential coronal slice acquisition, the periodic Nyquist ghost separation in the phase encoding direction is given by $\Delta y_g = \omega_c FOV_y N_{ex} TR/2\pi$ provided that $2\pi/T_{acq} \ll \omega_c$. Thus, increasing either FOV in y, number of imaging experiments ($N_{ex}$), time of repetition (TR), or adjusting $\omega_c$, will result in larger Nyquist ghost separation along the phase encoding direction. A rather straightforward method to obtain alias-free image signal distribution is to compute the Moore-Penrose pseudo-inverse of the composite encoding matrix E:

$$m_{full,0} = (E^H E)^{-1} E^H b_{full} \quad \text{Eq. 24}$$

Alternatively, Eq.23 can be solved in an iterative fashion. In any case, the quality of the reconstructed image will, among others, depend on the condition of matrix E. To properly reconstruct the image of the object with TDM-SENSE, all elements in E must be pre-known. To populate E accordingly, the computer program that controls the imaging pulse sequence has now a trivial task of keeping a time-track of all the k-space trajectories (if required), positions of the sensitivity map and applied transmit pulses. Most of this information is already available in the timing diagram of the imaging pulse sequence itself. Any imaging pulse sequence and gradient trajectories can in theory be used with this invention to form MR images Reduction of the Imaging Time with TDM-SENSE Referring to MR signal acquisition Eq.22, reducing the k-space trajectory by a factor of R in the phase encoding direction while traversing the full k-space FOV will result in the reduction of rows in B by the same factor (i.e. from J to J/R). Accordingly, the number of k-space samples for an Q=N×M image will be J/R=U×V/R, and so the number of available degrees of freedom would be insufficient to properly encode the image, resulting in aliasing artifacts after solving the reduced matrix system:

$$\begin{pmatrix} b(t_1) \\ \vdots \\ b(t_{J/R}) \end{pmatrix} = \quad \text{Eq. 25}$$

$$\begin{pmatrix} s(r(\omega_c t_1)_1)e^{-2\pi i k(t_1)\cdot r_1} & \cdots & s(r(\omega_c t_1)_Q)e^{-2\pi i k(t_1)\cdot r_Q} \\ \vdots & \ddots & \vdots \\ s(r(\omega_c t_{J/R})_1)e^{-2\pi i k(t_{J/R})\cdot r_1} & \cdots & s(r(\omega_c t_{J/R})_Q)e^{-2\pi i k(t_{J/R})\cdot r_Q} \end{pmatrix}$$

$$\begin{pmatrix} m(r_1) \\ \vdots \\ m(r_Q) \end{pmatrix}$$

In order to maintain the full rank of B, the rotating RF coil has the potential to generate a new set of degrees of freedom that can substitute for the missing J/R rows in B. This can be accomplished by increasing the sampling rate in the ADC by a factor of at least R, so that during a fixed acquisition time period $T_{acq}$, an R-fold increase in unique sensitivity maps will take place. Moreover, if one also increases the rotational frequency of the RF coil, $\omega_c$, a set of better separated sensitivity maps along the angular direction can be obtained. In this way, the ultimate spatial resolution afforded by the increased number of different sensitivity maps is enhanced. Corresponding doctrines apply for spatially selective magnetization excitation where a reduction in the k-space trajectory by $R_T$ during transmission can be compensated for by at least an $R_T$-fold increase in both $\omega_c$ and the number of samples P in $b_1(t)$.

Accordingly, it will be appreciated that the rate of imaging can be controlled using the above described technique. In particular, the rate of imaging is related to the rate of movement of the field component, such as the rate of rotation of the coil, as well as the rate of sampling of the received signals. In the event that faster imaging is required, this can be achieved by increasing the rate of movement and the sampling rate.

Accordingly, this provides a mechanism for allowing the imaging rate to be controlled by a processing system. In practice, this can be achieved by having the MR instrumentation determine the required imaging rate and then control the signal sampling to thereby sample signals received by the receive coil at a required. Additionally, the MR instrumentation 9 operates the controller 7, and hence the drive 6, to thereby cause movement of the coil or shield at the rate required by the imaging rate. It will therefore be appreciated that this allows a processing system, such as the MR instrumentation 9 and/or the controller 7 to control the rate of imaging.

Combined Rotating Transmit and Receive SENSE

The rotating transmit and receive SENSE concepts can also be fused. The interplay of transmit and receive SENSE in time has a wide range of combinations. For instance, this allows all of the RF samples to be transmitted first and before receiving of the FIDs/echoes commences. Alternatively, a certain segment of the intended RF samples can be transmitted and required FIDs/echoes received, with this being repeated until all RF samples are transmitted and FIDs/echoes received.

Thus, for example, multiple coils could be provided, with each coil being for transmitting a respective segment of RF pulse samples and/or receiving respective decay or echo signals. If each coil is tuned to a different frequency, this allows RF pulse samples to be transmitted to a respective axial slice of the subject or for respective decay or echo signals to be received from a respective axial slice of the subject.

This interplay can be conducted during one or more coil revolutions, depending on the method.

A simultaneous excitation of RF pulses on multiple stationary coils (channels) can often lead to constructive wave interferences/dielectric resonance effects and consequently to an unacceptably large specific absorption rate (SAR), especially at high static field strengths. Instead of playing out the required RF samples in synchrony, a serial transmission of the pulses on a single rotating (moving) RF coil can result in a reduced SAR since less constructive wave interference would be anticipated. On the other hand, imitation of a large number of sensitivity profiles during coil rotation (motion) over time may also result in a better signal to noise figure compared to standard stationary RF constructs.

Rotating Birdcage Resonator

It is interesting to note that transmission of a suitable sinusoidal-like RF waveform during the RF coil rotation can yield an RF field $B_1$ having a distribution identical to that of a C-leg birdcage resonator (here, C being the number of stationary birdcage coil stubs), which is an important application in MRI.

Figures 14A, 14B:
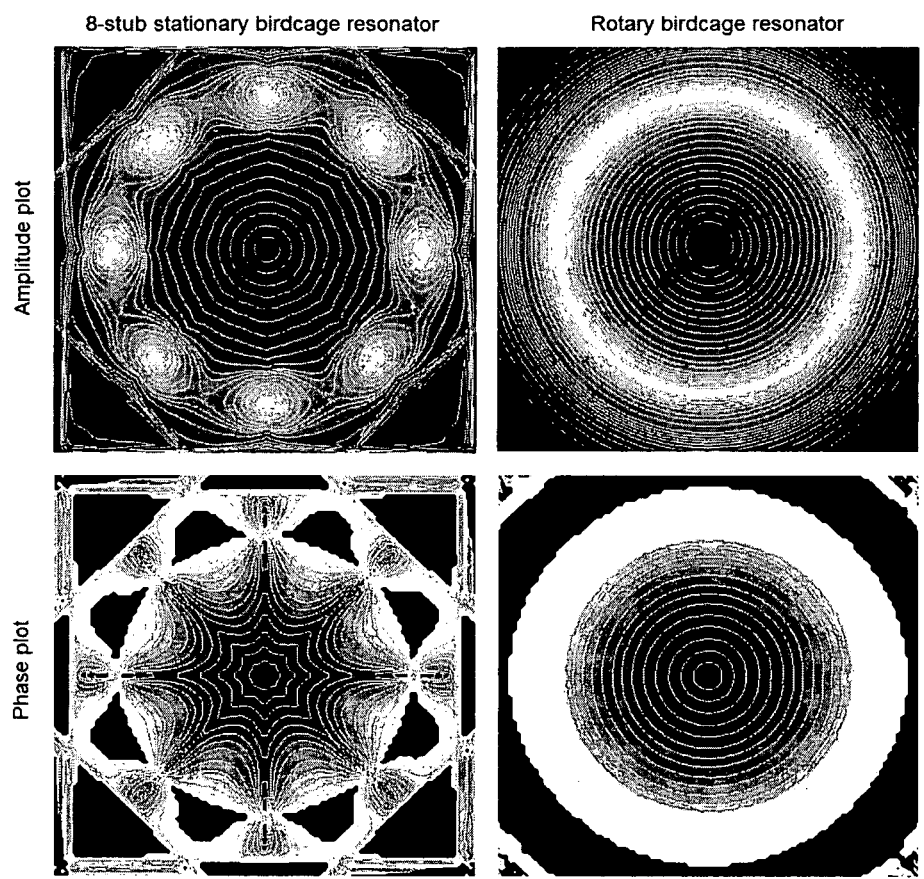

An example of this is shown in FIGS. 14A and 14B.

FIG. 14A shows simulated amplitude and phase plots obtained with a conventional stationary 8-stub birdcage resonator. This highlights how the region of uniformity is confined in a star-shaped streamline structure. Similar results are also shown in FIG. 14B, for a single rotated stub (similar to the arrangement of FIG. 2B) that is undergoing a rotation while transmitting a sinusoidal RF waveform. The period of the sinusoidal waveform is in this case equal to one period of coil rotation, which in effect mimics a birdcage structure with a large number of virtual birdcage rods. If the coil is rotated at say 6000 rpm, then the transmission of the sinusoidal waveform would be confined within a time period of 10 ms, which is a reasonable compromise between RF transmission time length and the attained RF field $B_1$ spatial uniformity.

Rotation of a single stub can therefore effectively imitate a large number of virtually stationary rods and in fact provides an improved uniformity profile for the RF field $B_1$, and enhanced SNR.

Also, a plurality of rods with dedicated time-varying current waveforms can be rotated to achieve other desired spatiotemporal RF effects during system rotation.

Multi-Tuned X-Nucleus Rotating RF System

Another application of the rotating MRI concept is for spectroscopy and X-nucleus MRI applications, where it is often very difficult to physically arrange and decouple coil arrays that are tuned and matched to different nuclei. For instance, it is feasible to configure two RF coils to be physically 90° to each other, so that they are naturally mutually decoupled. Each coil can be tuned and matched to a different Larmor frequency (f.e. $^1$H and $^{23}$Na frequency). During the rotation of the double-tuned transceiver, a uniform (or targeted) nucleus-dependent excitation and RF signal reception from the two distinct nuclei can be obtained simultaneously. This can provide multi-level morphologic and quantitative information on the sample.

Accordingly, multi-tuned coils or coil arrays are feasible with the moving apparatus concept. The above described moving apparatus therefore provides a new system and method for uniform or targeted excitation of magnetization and subsequent signal reception.

It will be appreciated that this can be achieved using a variety of apparatus configurations and an example of an alternative specific arrangement will now be described with reference to FIGS. 15A to 15E.

In this example, the apparatus includes a cylindrical sample tube 1511 adapted to support a subject 1505, such as a small animal or a sample, allowing these to be positioned within an imaging region of an imaging system. The drive includes a turbine 1510 mounted to a support 1516A. The turbine 1510 may be of any suitable form, but in one example is a plastic pneumatic turbine capable of high angular velocities (up to ~10,000 rpm or more). A cylinder 1514 is provided having a first end mounted to a flange 1518, which is in turn coupled to the turbine 1510 by a shaft 1524. The arrangement is such that operation of the turbine 1510 causes rotation of the cylinder 1514 about a rotation axis.

Whilst other sample holding arrangements or geometries are possible, use of the sample tube 1511 also allows a stationary receive or transmit-only coil to be supported, allowing this to be used in cross-coil operation with a rotating transmit or receive-only coil 1513 situated on the cylinder 1514. It is also possible to use a single transceive coil provided on the rotating cylinder 1514. In this example, the coil 1513 is made of a number of copper metallic strips, although any suitable coil configuration can be used.

The sample tube 1511 can incorporate an RF shield 15 formed from a portion of the use of the sample tube 1511 extending radially outwardly and then axially so as to surround the cylinder 1514.

In this example, the sensor includes an infra-red (IR) photo interrupter 1522 placed aptly near an IR semi-transparent disc 1523 that is firmly attached to the shaft 1524 of the turbine 1510, allowing rotation of the cylinder 1514 to be monitored. The sensor is coupled to a shield 1530, which is in turn coupled to the support 1516A.

It will be appreciated that remaining components, such as the processing electronics are not shown in this example for clarity, and that in practice these would be similar to components described for previous examples.

Figures 16A, 16B, 16C:
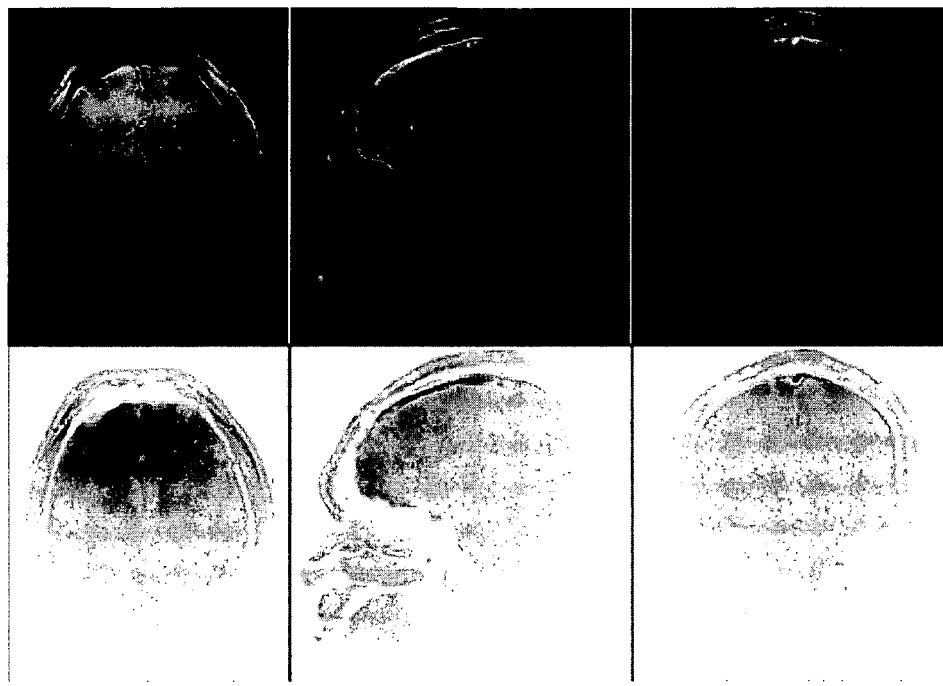
FIGS. 16A to 16C are example positive and negative axial, sagittal and coronal images of a head taken with a static RF coil.
Figures 16D, 16E, 16F:
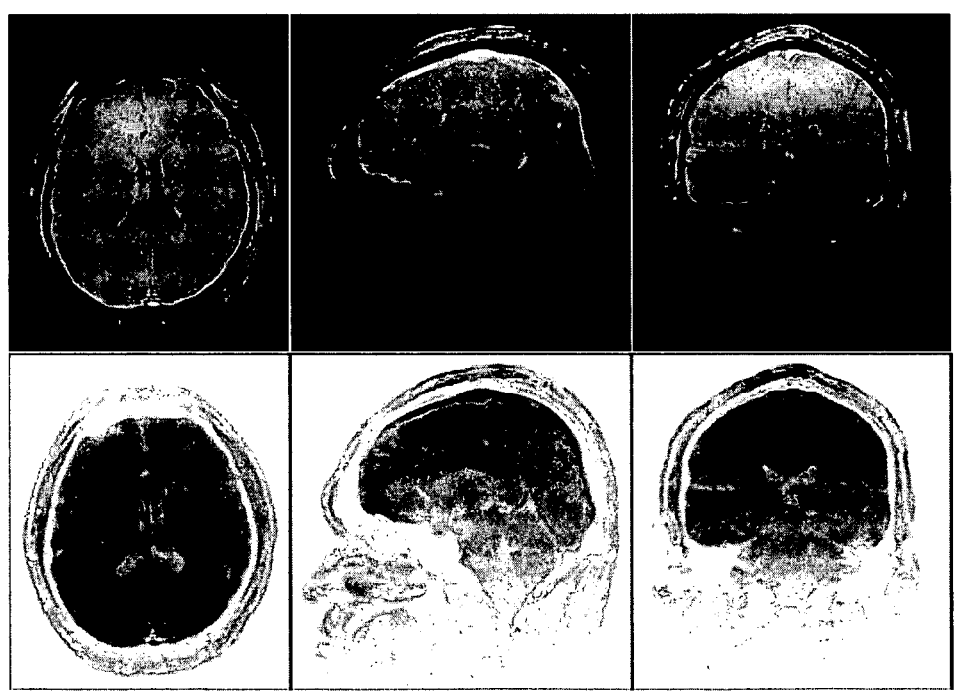
FIGS. 16D to 16F are example positive and negative axial, sagittal and coronal images of a head taken with a moving RF coil.

Examples of axial, sagittal and coronal plane brain images of a 34 year old male obtained when the RF coil was stationary positioned at 0° angular position are shown in FIGS. 16A to 16C. This highlights only partially 'illuminated' images are obtained. Equivalent images obtained using the rotating coil arrangement of FIGS. 15A to 15E rotating at 480 rpm are shown in FIGS. 16D to 16F, highlighting the uniformly illuminated images of the male brain.

In the above examples, the field component is a coil so that the RF system acts as a coil moving apparatus to move the coil 4 relative to the imaging region. However, this is not essential and a similar effect can be achieved by using a field component in the form of a shield, so that the RF system 3 acts as a shield moving apparatus. Examples of this arrangement will now be described with reference to FIGS. 17, 18 and 19.

Figure 17A:
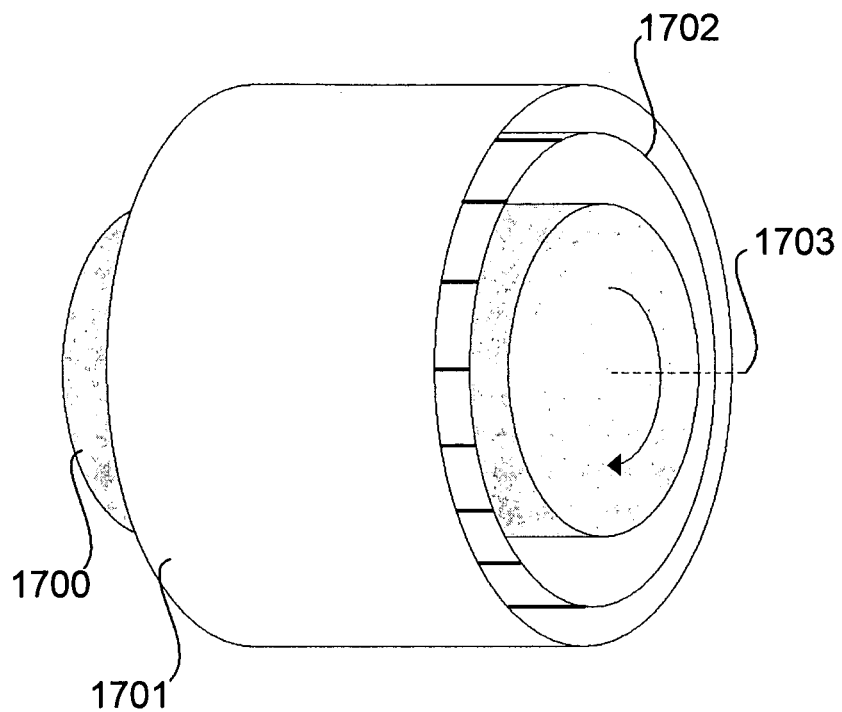
FIGS. 17A to 17D are schematic isometric views of first examples of RF shield moving apparatus.

In particular, FIG. 17A illustrates a fixed RF transmitter/receiver 1702, such as a conventional volume resonator or RF coil array that surrounds shield moving apparatus 1700 for moving (or otherwise rotating) a shield such as a slotted RF shield, around an axis 1703. In turn, the RF transmitter/receiver 1702 can be shielded by an additional RF shield 1701 to minimize the power losses. In practice, the imaging system is not restricted to a particular RF system 1702/1701 and any existing RF system 1701/1702 can be employed. Such a system may consist at least of transmit-only RF coils, receive-only RF coils, transceive RF coils and any combination of those. In addition, these systems can be fixed or moving themselves.

Figure 17B:
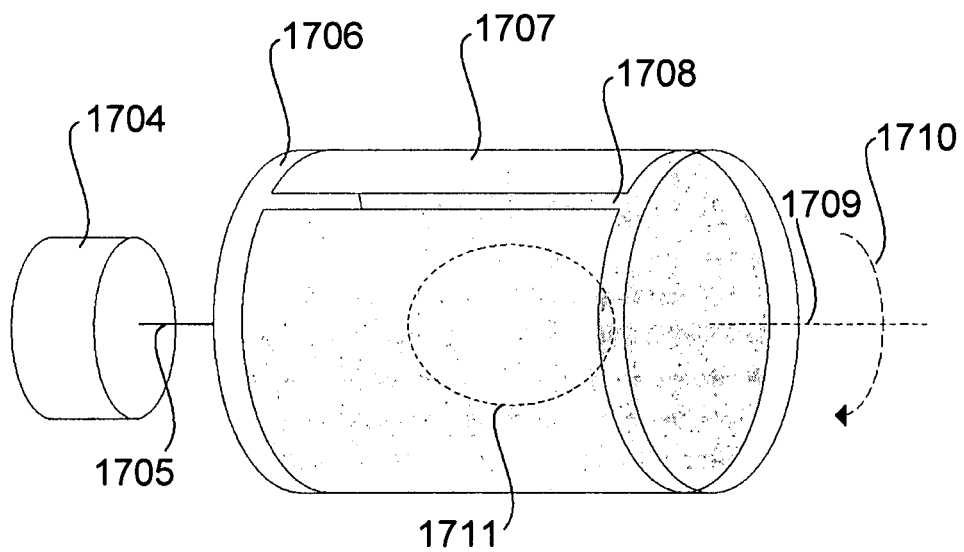
Figure 17C:
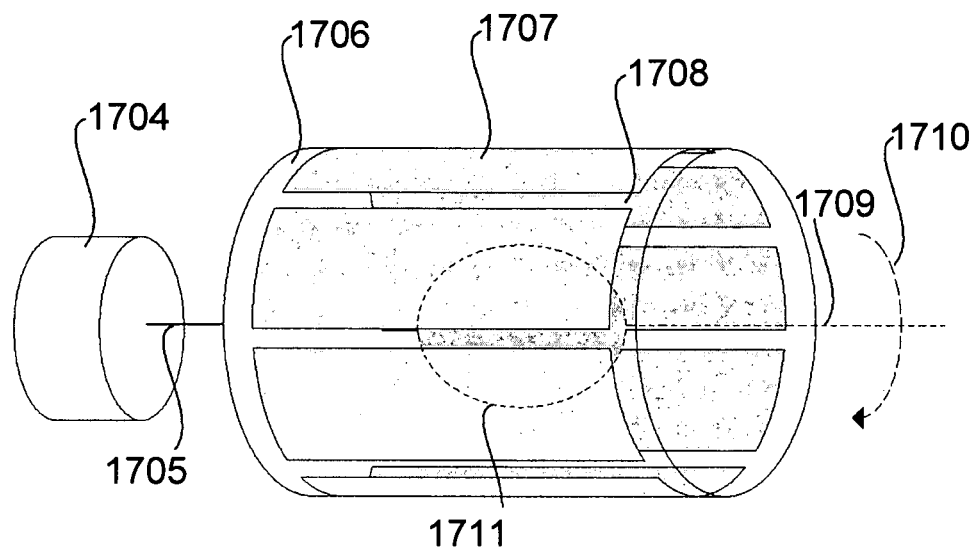
Figure 17D:
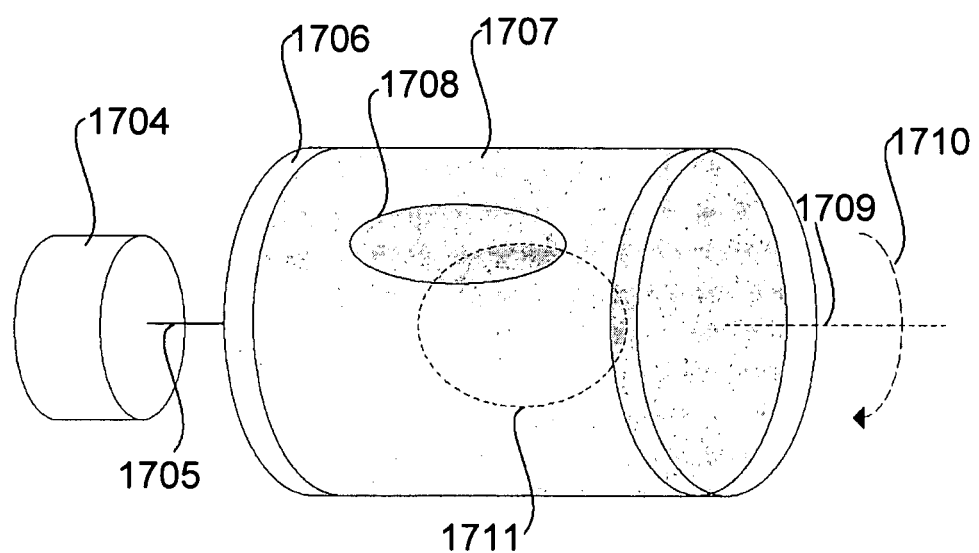

Examples of the shield moving apparatus 1700 are shown in FIGS. 17B to 17D. In these examples, the shield moving apparatus generally consists of a substantially cylindrical body 1706, on which an RF shield 1707 with slot(s) 1708 is attached. In this example, a drive 1704 rotates the structure 1706/1707 about the axis 1709, as shown by arrow 1710, and thus about the imaging region of the patient/sample 1711, via a connection or axle 1705.

The example drawings of FIGS. 17C and 17D show that the shield can have multiple slots, arranged in an arbitrary fashion, and that these slots can be of different geometry, such as elliptic, circular, concave or any other desired geometries.

Analogous examples of the moving RF shield apparatus for the use in cylindrical or open MRI system, or other imaging systems, are shown in FIGS. 18A to 18D and 19A to 19D. In particular, these examples relate to in-plane linear motions and rotations of the slotted RF shield, respectively.

Figure 18A:
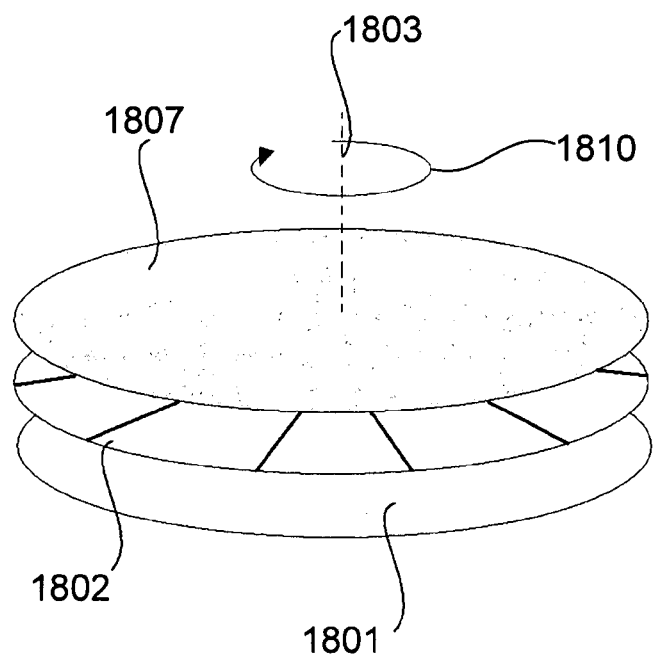
FIGS. 18A to 18D are schematic isometric views of second examples of RF shield moving apparatus.
Figure 18B:
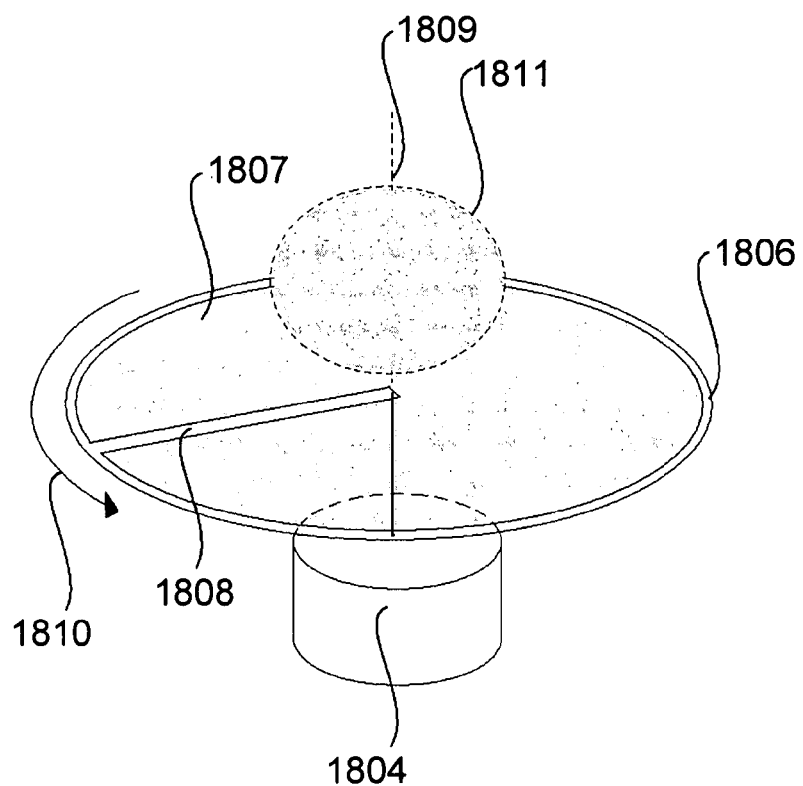
Figure 18C:
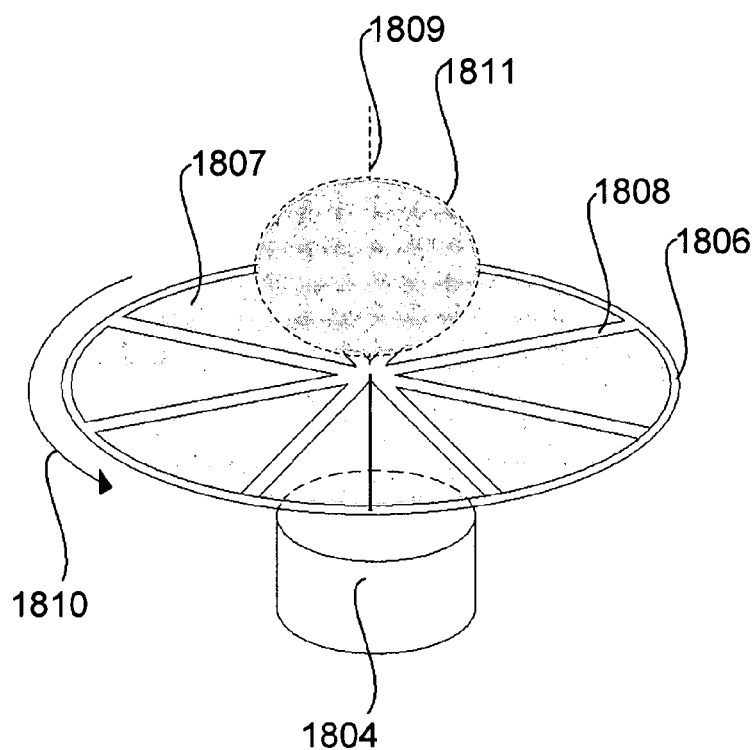
Figure 18D:
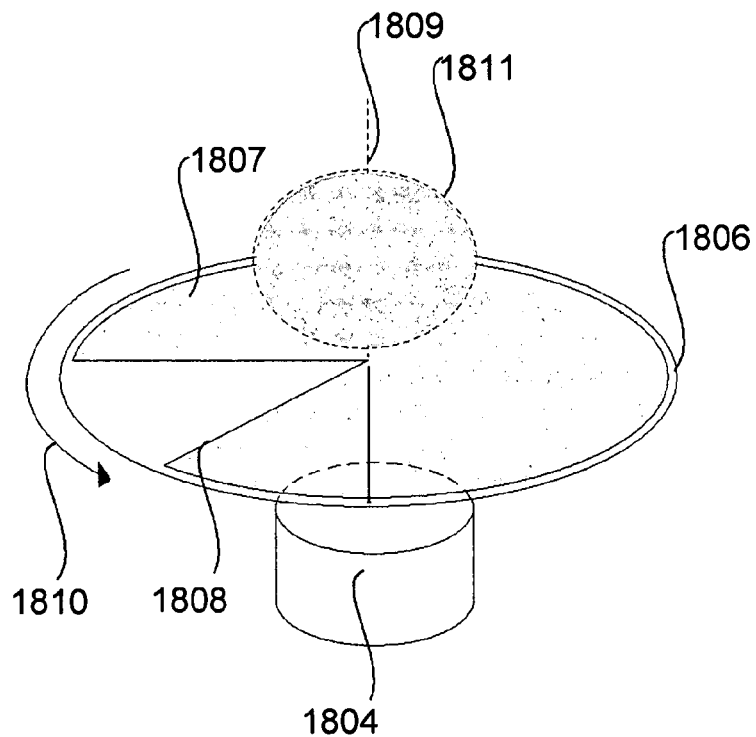

FIG. 18A shows an RF structure 1802/1801 for transmitting and/or receiving an RF field in the usual manner. A shield 1807 is arranged to rotate about an axis 1803, as shown. FIGS. 18B to 18D are expanded views of different moving RF shields 1807.

In the example of FIG. 18B, the RF shield 1807 with a slot 1808 is flat on a substantially planar body 1806, which is coupled to a drive (here: rotor) 1804, via an axle 1805, that rotates (see arrow 1810) the support body 1806 about the axis 1809 and thus about the imaged subject 1811. These examples also illustrate that multiple slots 1808 (FIG. 18C) arbitrarily arranged, and slots of different, arbitrary, geometry (FIG. 18D) can be used.

Figure 19A:
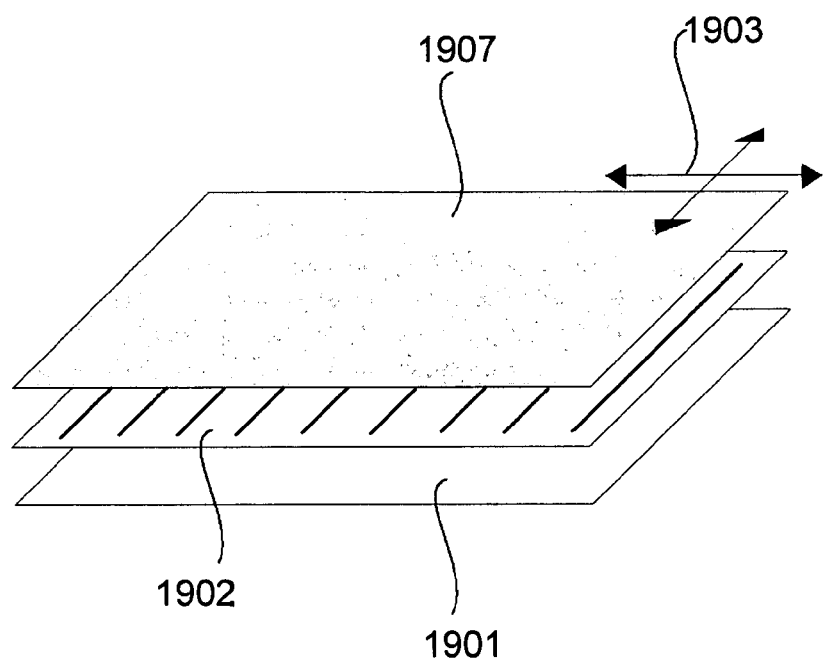
FIGS. 19A to 19D are schematic isometric views of third examples of RF shield moving apparatus.
Figure 19B:
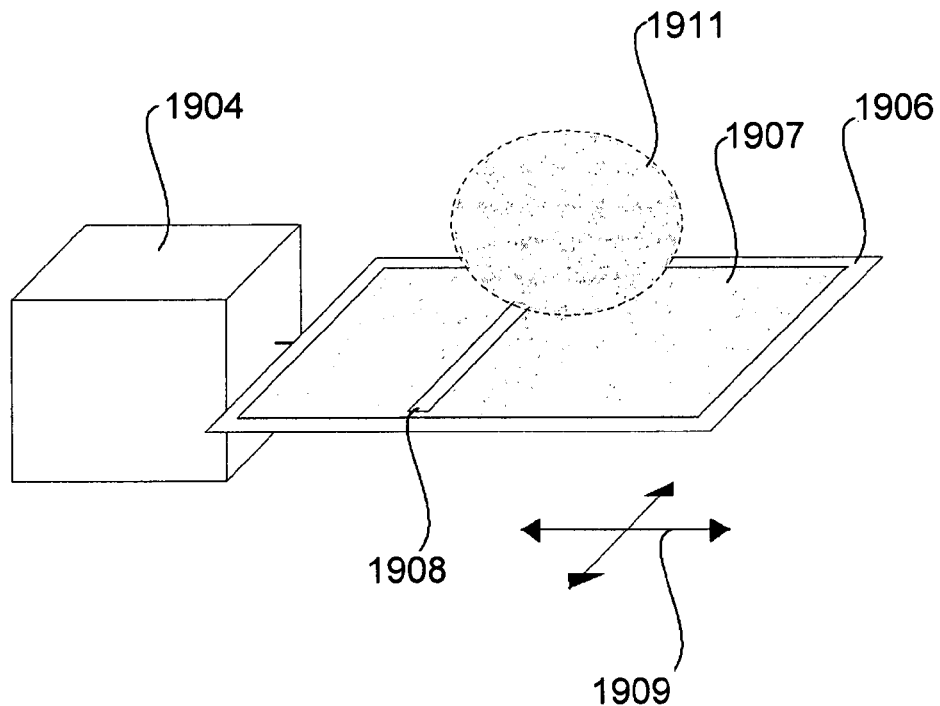
Figure 19C:
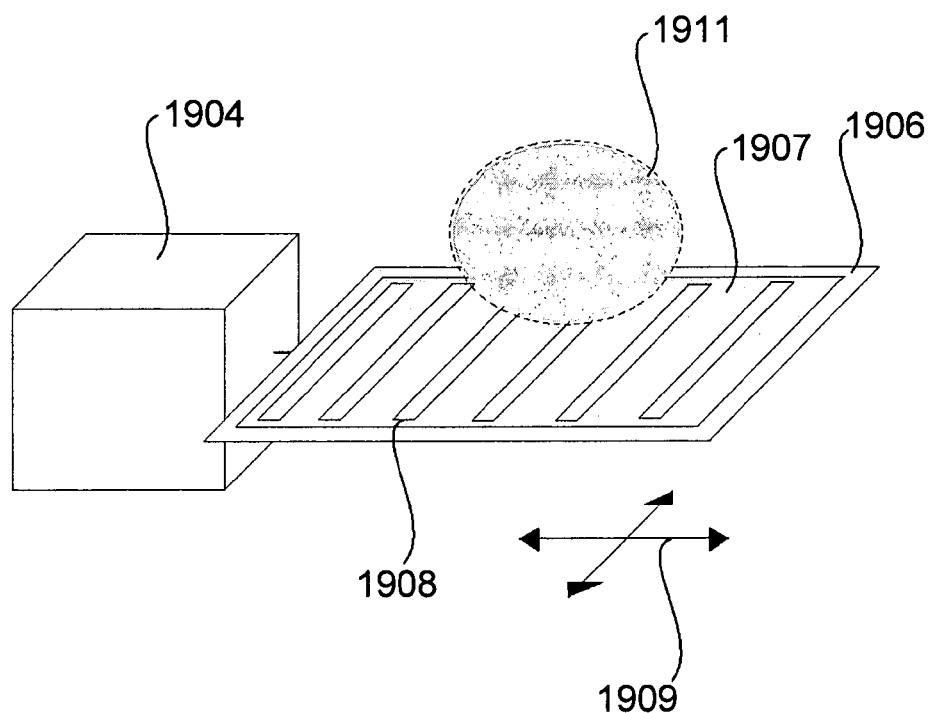
Figure 19D:
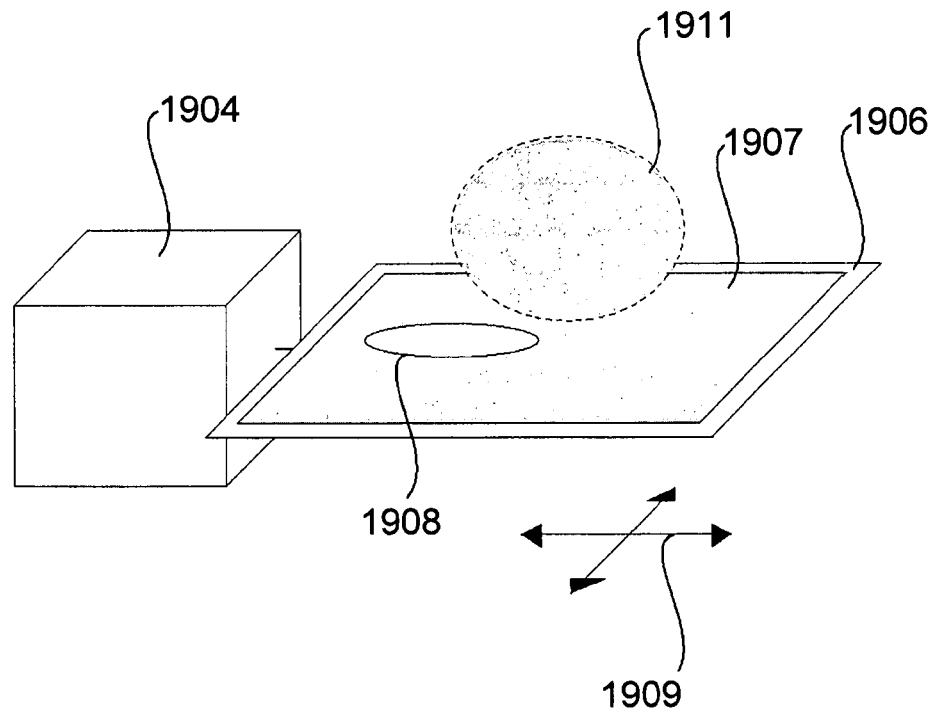

FIG. 19A shows an RF structure 1902/1901 for transmitting and/or receiving an RF field in the usual manner. A shield 1907 is arranged to rotate reciprocate in a plane, as shown at 1903. FIGS. 19B to 19D are expanded views of different moving RF shields 1907.

In the example of FIG. 19B, the RF shield 1907 with a slot 1908 is flat on a substantially planar body 1906, which is coupled to a drive 1904, such as a linear actuator, via a push rod 1905. The linear actuator, which can be of any suitable form such as pneumatic piston, is arranged to allow reciprocal linear movement of the RF shield 1907 on the support structure 1906, relative to the imaging region 1911, as shown by the arrows 1909. These examples also illustrate that multiple slots 1908 (FIG. 19C) arbitrarily arranged, and slots of different, arbitrary, geometry (FIG. 19D) can be used.

It should be bourn in mind that the motion of a slotted RF shield in a priori established RF field is not constrained to only the physical planes described in FIGS. 17 to 19. The motion of the RF shield can be in any physically allowable plane. Moving the slotted RF shield 1707, 1807, 1907 relative to the imaging region allows a greater range of measurements to be performed when compared to the prior art. In particular, this allows a range of arbitrary RF field profiles to be generated in the imaging region through selection of suitable RF pulse sequences, shield configurations and shield movements.

In a manner similar to that of the coil moving apparatus described above, the shield moving apparatus is not restricted to a particular material type or a particular choice of the driving system. In one example, the drive 1704, 1804, 1904 is a mechanical drive such as an electric, pneumatic, hydraulic or any other kind of motor or turbine. The drive 1704, 1804, 1904 may be non-magnetic to thereby avoid interference with the measurement process within the main magnet 1, although this is not essential if the drive 1704, 1804, 1904 is sufficiently shielded from the remainder of the imaging system.

The drive 1704, 1804, 1904 can be controlled by the MR instrumentation 9, to cause a particular movement (or otherwise rotation) of the slotted RF shield about the imaging region. The controller 7 may therefore be of any suitable form, and in one example is a processing system, such as a field programmable gate array (FPGA), or other suitable configurable device.

The MR instrumentation 9 is also typically adapted to cause electrical signals to be transmitted or to be received from the RF transmitter/receiver 302, thereby causing the RF transmitter/receiver 302 to generate RF field pulses or detect the MR signal from the imaged subject in the usual manner. Accordingly, the MR instrumentation may include any suitable instrumentation, such as MR spectrometers, RF instrumentation and the like.

In each of the above example arrangements of FIGS. 17 to 19, when the RF field is transmitted or received via the RF structure 1702/1701, 1802/1801, 1902/1901 in the usual manner, the RF field is resonant at the slot(s) 1708, 1808, 1908 of the RF shield 1707, 1807, 1907, which is closest to the imaged subject. In this case, the geometry of the tuned slot(s) (resonant at the Larmor frequency), properties of the shielding material (here, RF shield 1707, 1807, 1907), distance between the slot and the RF transmitter/receiver 1702, 1802, 1902 among others, dictates the spatial RF profile.

This spatial RF field windowing/filtering process allows the structure 1702, 1802, 1902 to 'sense' only part of the imaged subject as the slotted RF shield 1707, 1807, 1907 moves relative to the imaged subject 1711, 1811, 1812, while over time, the entire subject 1711, 1811, 1911 is 'illuminated' or 'scanned' by the windowed RF field. The time required to 'illuminate' or 'scan' the entire subject 1711, 1811, 1911 in the given imaging region depends on the speed of the moving (or otherwise) rotating RF shield 1707, 1807, 1907. The benefit of this approach is that the dominant noise from outside the region of interest is significantly attenuated by the RF shield 1707, 1807, 1907 for a given time point during the motion of the RF shield 1707, 1807, 1907. This effectively improves the SNR in the resulting image after all the MR signals from the entire subject are received and spatially encoded.

In another example, the moving slotted RF shield apparatus includes a controller 7, such as a processing system, that may consist of different sub-modules. The processing system operates with, controls or is controlled by the MRI system instrumentation. In effect, the controller 7 determines and controls both the position and movement of the slotted RF shield relative to a chosen frame of reference. The controller may also prepare/trigger the transmission of RF fields and measure/analyse the MR signals depending on the determined position or movement of the slotted RF shield, although alternatively separate control mechanisms may be provided.

Figure 20:
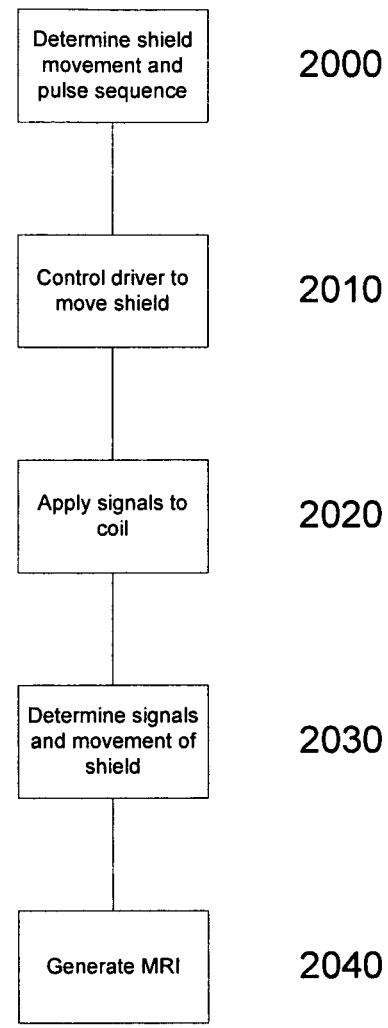
FIG. 20 is a flow chart of an example of an imaging process.

An example of a measurement process will now be described with reference to FIG. 20.

In this example, at step 2000, a shield movement and RF pulse sequence is typically determined. This may be achieved in any suitable manner, but in one example, involves a user selecting a measurement procedure using the controller 7 or another processing system. This allows the controller 7 to access pre-stored data representing previously determined shield movements and pulse sequences that achieve the selected measurement procedure. Alternatively, however, this information may be provided manually.

At step 2010, the controller 7 causes the shield 307 to be moved relative to the imaging region 311. In one example, this is achieved by having the controller 7 activate the drive 304, thereby causing the required shield movement. As part of this process, the controller 7 may provide information regarding the position and/or movement of the shield 307, to the MR instrumentation 9. This can be used as part of the subsequent analysis, and/or to allow the MR instrumentation 9 to trigger the measurement process, for example when the shield reaches a desired movement speed.

At step 2020, the controller 7 or MR instrumentation 9, causes signals to be applied to the RF system 3, causing the RF coils to generate a required RF field, to which the subject is exposed. In one example, this is achieved by having the MR instrumentation 9 generate signals that are applied to the RF system.

At step 2030, the controller 7 or MR instrumentation 9 determines measurements of signals in the RF coils resulting from detected decay or echo signals, and optionally determines movement of the shield 1707, 1807, 1907. The RF signals are typically measured by suitable processing electronics, with this information being provided to the MR instrumentation 9. Similarly, the MR instrumentation 9 can determine movement of the shield 1707, 1807, 1907 from the controller 7, which in turn typically determines this using a suitable sensor.

At step 2040, the movement of the shield 1707, 1807, 1907 and the resulting RF field are used by the MR instrumentation to generate an image or other data. The manner in which this is performed will depend on the measurement procedure performed, and examples will be described in more detail below.

It will also be appreciated that whilst the controller 7 and the MR instrumentation 9 are described as discrete components in the above example, this is not essential, and the function of the controller 7 and MR instrumentation 9 could be provided by a single suitably configured device.

Figure 21:
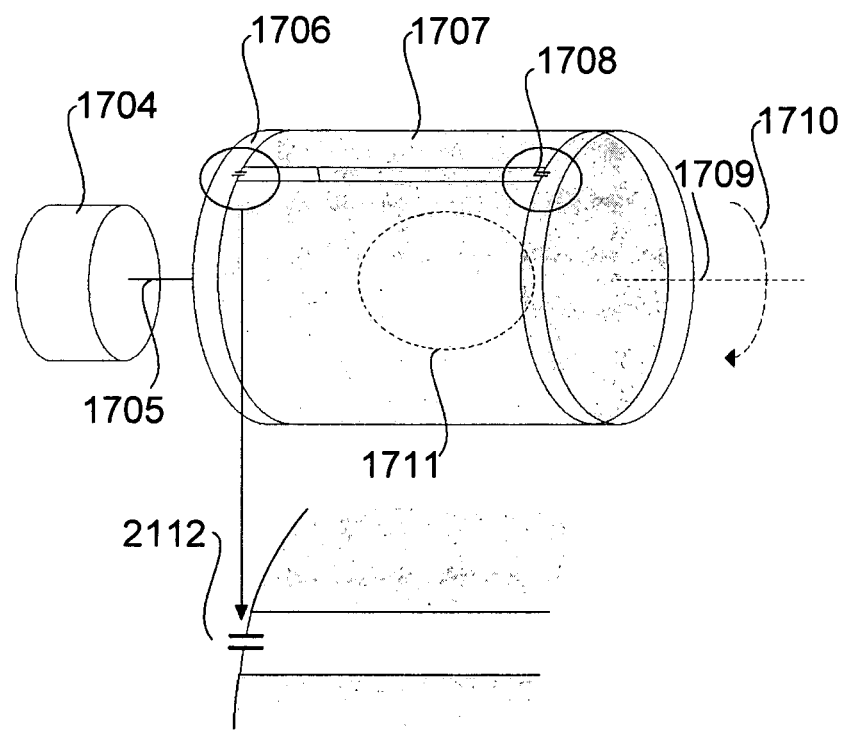
FIG. 21 is a schematic view of an example of electrical components attached to the moving slotted RF shield.

In another example, as shown in FIG. 21, which is a modified version of the shield arrangement of FIG. 17B, the slotted RF shield includes electronic components such as capacitor(s) 2112, or additional electrical circuits, that enable persons skilled in the art to make the structure resonant at the frequency of interest. This effectively allows a certain, narrow bandwidth of signal frequencies to pass through the slot and others to be attenuated.

Figure 22:
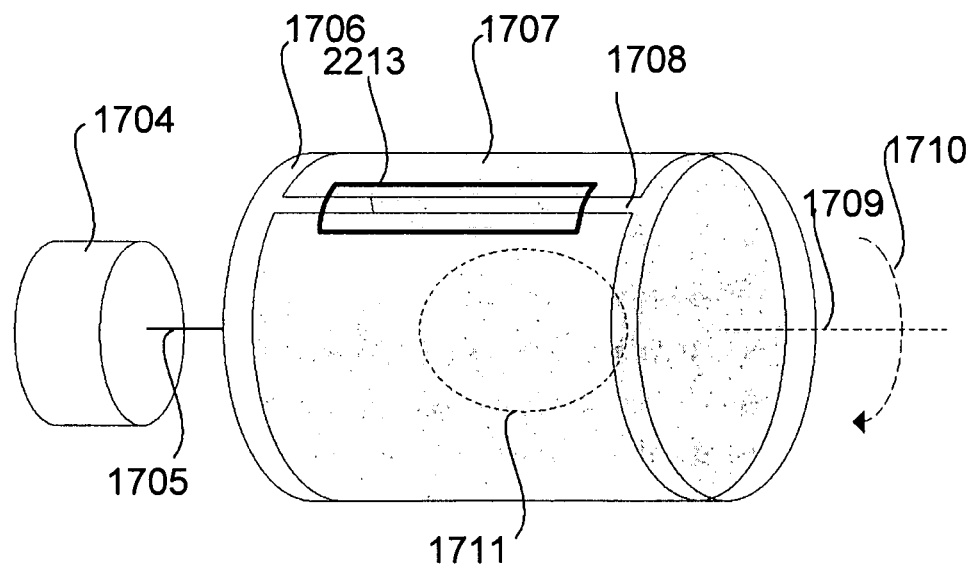
FIG. 22 is a schematic diagram of an example of an imaging system incorporating a hybrid version of a moving slotted RF shield and a RF coil.
Figure 23:
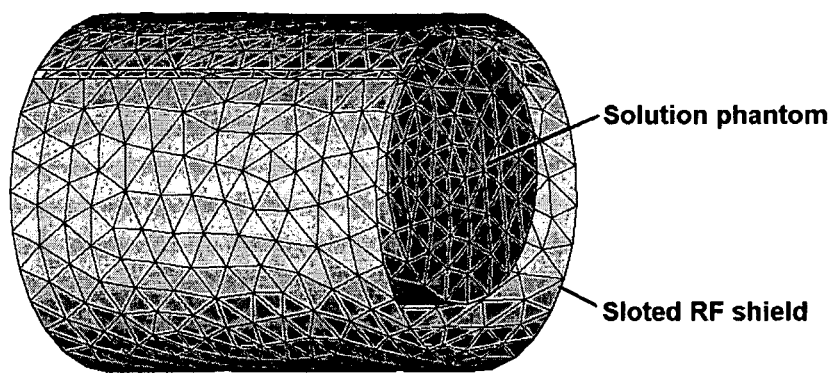
FIG. 23 is a graphical representation of the configuration of a computer simulation involving a slotted RF shield and a solution based phantom.

In another example, as shown in FIG. 22, the slotted RF shield can be used in conjunction with a RF coil 2213 that moves (or otherwise rotates) with the slotted RF shield. In this hybrid system, the user is in position to tailor the spatial RF field profile according to a particular requirement and tailor the SNR properties.

The main advantage of the moving (or otherwise rotating) slotted RF shield 1707, 1807, 1907 relative to the imaged subject in an already established RF field via a conventional transmitting/receiving structure 1702, 1802, 1902 is that it emulates an arbitrary number of RF field sensitivity profiles. In this regard, a wide range of different field sensitivity profiles, such as providing rotating sensitivity encoding, virtual stationary coils simulating the effect of different stationary coil arrangements, or the like, can be implemented by suitable movement of the shield in time with suitable RF pulse sequences.

The principles and schemes of RF coil emulation are similar to those that can be achieved by moving an RF coil relative to the imaging region. In such an example, the imaging system includes a coil moving apparatus, having a drive, for rotating or otherwise moving a coil, relative to the imaging region of the imaging apparatus. The coil is used in generating RF fields or detecting emitted RF signals, such as decay or echo signals. Accordingly, the coil may be a receive only, transmit only, or transceive coil.

Motion of the RF coil is an additional degree of freedom in MR imaging in that it emulates a conventional array of RF coils in a fashion akin to time-division-multiplexing. This approach is based on the notion that the frequency of both the RF transmission field and the resonating $^1$H nuclear spin (i.e. tens to hundreds of MHz) is six orders of magnitude larger than the dynamics of the RF coil (i.e. tens to hundreds of Hz). Therefore, in the temporal frame of reference of the RF transmission field and the nuclear spin, the moving RF coil is perceived as 'physically stationary' while the spin system is excited and the MR signal is induced in the RF coil. As the net magnetization is tipped into the transverse plane or the MR signal decays, a rapidly moving (for instance, rotating) RF transceive coil can be perceived as multiple stationary coils analogous to a conventional N-element RF transceive array.

This arrangement is discussed in more detail above with respect to the coil moving apparatus.

The shield moving technique therefore provides an alternative method for the generation of multiple RF field profiles (i.e. emulation of an RF array) for sensitivity encoding of MR signals analogous to the moving RF coil approach. This technique is easily implemented in any existing MRI system and does not require inductively coupled transfer of MR signals from or to the RF system, as a slotted RF shield is moved relative to the patient/sample rather than moving the RF coil(s).

It will be appreciated that the above described systems therefore allow any field component to be provided on a body, which when moved modifies the electromagnetic field thereby influencing either the profile of the RF field generated in the imaging region, or the sensitivity profile for detection of echo signals. In one example, the field component is an RF coil used in generating or sensing the RF field, whilst in another example, the field component is a shield adapted to selectively shield the imaging region from the RF coil. In either case, the use of a field component that influences the RF field generated or detected allows a range of different field profiles to be established which cannot normally be achieved using static arrangements.

The shield moving technique also provides some additional benefits.

For example, in conventional RF systems, fields from multiple sources are incident at the same time point T and add constructively in one region of the tissue G. In one example, using a slotted shield, at time point T the RF field emanates from only one source and 'illuminated' the tissue region G, while over time, during one or more shield revolutions, the RF field illuminates the entire tissue volume. The above described shield moving technique should therefore bring about smaller Specific Absorption Rates (SAR) in the tissue.

The shield moving technique is able to tailor RF field(s) using the geometry and properties of the slot(s), so that the tailored RF field becomes a useful modulation function in amplitude or frequency encoding of either transmitted or received RF signals.

The shield moving technique is useful in accelerating imaging by modulating/encoding the transmitted or received RF signals to and from the sample in conjunction with some or without any switching of magnetic field gradient coils. In this mode of imaging, the moving sensitivity profile(s) of the field emanating from the shield slot(s), which is known by the user, is used as a moving RF field encoding function in the generation of MR images.

In further examples, the shield moving technique can be adapted for multi-nuclear and/or multi-slice imaging by provision of multiple slots that resonate at different frequencies. In multi-slice imaging, if a $B_0$ gradient field is applied along the direction of the slices to be imaged, a plurality of slots can be arranged in the same direction, where each slot is tuned to a frequency as a function of $B_0$ gradient field strength. In multi-nuclear imaging, images of N different nuclear species can be simultaneously acquired by providing N slots, where each slot is tuned to the frequency of nucleus N. In this example, these slots act as high-gain filters for chosen frequencies of interest. Provided that the transmission and reception coils outside the moving RF shield structure are able to excite and detect the electromagnetic energy from the nominated nuclear species, multi-nuclear imaging using a slotted RF shield that moves relative to the images object becomes viable. In both examples, amplitude modulating functions of the moving RF field is a further feature that enables accelerated acquisition of the multi-nuclear or multi-slice images.

In one example, a geometry of slot(s) in the shield is adjustable. Considering a general geometry function $g(x,y,z)$ and electromagnetic/structural material properties $h(x,y,z)$ of the shield, which vary as function of space $(x,y,z)$. Then the geometry of the slot(s) $s(x,y,z,t)$ in the shield may be a function of space and time $(x,y,z,t)$. That is, the slot geometry can change over time to achieve an additional degree of freedom in tailoring of the electromagnetic field in the region of the imaged object as the slotted RF shield is moving. In one example, the configuration of the slots can be controlled by the controller 7, allowing the slot configuration to be adjusted during movement of the body, and hence during a measurement procedure, thereby providing greater control over the resulting RF field profile.

Furthermore, the values of electronic circuit components may also be function of time to add one additional degree of freedom in tuning and matching the electromagnetic properties of $s(x,y,z,t)$ as the RF shield is moving. Again, the value of the components can be controlled by the controller 7, during a measurement procedure, thereby providing greater control over the resulting RF field profile. Such control can be achieved by controlled mechanical and electrical adjustment of the slot window and the electronic component values via the controller 7 during the rotation of the RF shield.

The following computer simulation and experimental imaging examples were conducted to illustrate one example shield moving technique.

MRI Computer Simulation and Experimental Examples

To verify the principles of the shield moving technique, an example cylindrical RF shield was simulated in the software package FEKO and constructed for use in MRI experiments. In both simulation and experiment, a thin copper sheet was wound on a plastic cylindrical body 1706 that measured 160 mm in diameter and 195 mm in length. In one experiment, a 5 mm wide slot 1708 was cut along the entire length of the copper shield 1707. In this example, capacitors 2112 were included on both ends of the slot to make the structure resonant. A cylindrical saline-based solution phantom 1711, measuring 120 mm in diameter and 195 mm in length was inserted into the RF shield so that the phantom was closest to the RF shield where the slot was made (see FIG. 23). The solution phantom had dielectric properties of $\sigma=0.2$ S/m and $\in_r=76$. The slot was then tuned to 85.45 MHz (i.e. for 2 Tesla field strength) under sample loading conditions. The experiment were then performed in a whole-body 2 Tesla (T) MRI system at The University of Queensland (Brisbane, Australia).

The RF shield and the solution phantom 1711 were placed in the isocentre of the magnet. The MRI system was operating in the transceive mode. That is, RF transmission fields were established via the whole body RF resonator 1702, and the MR signals were received in quadrature via the whole-body RF receiver (also part of system 1702).

Using the Paravision 4 software (Bruker, Germany), a Fast Low Angle SHot (FLASH) imaging pulse sequence with following parameters was applied: time of repetition (TR) =100 ms, time of echo (TE)=8.2 ms, flip angle (FA)=30 degrees, matrix size: 256×256 and number of experiments (NEX)=1 (NEX is normally referred to number of averaging).

Figure 24A:
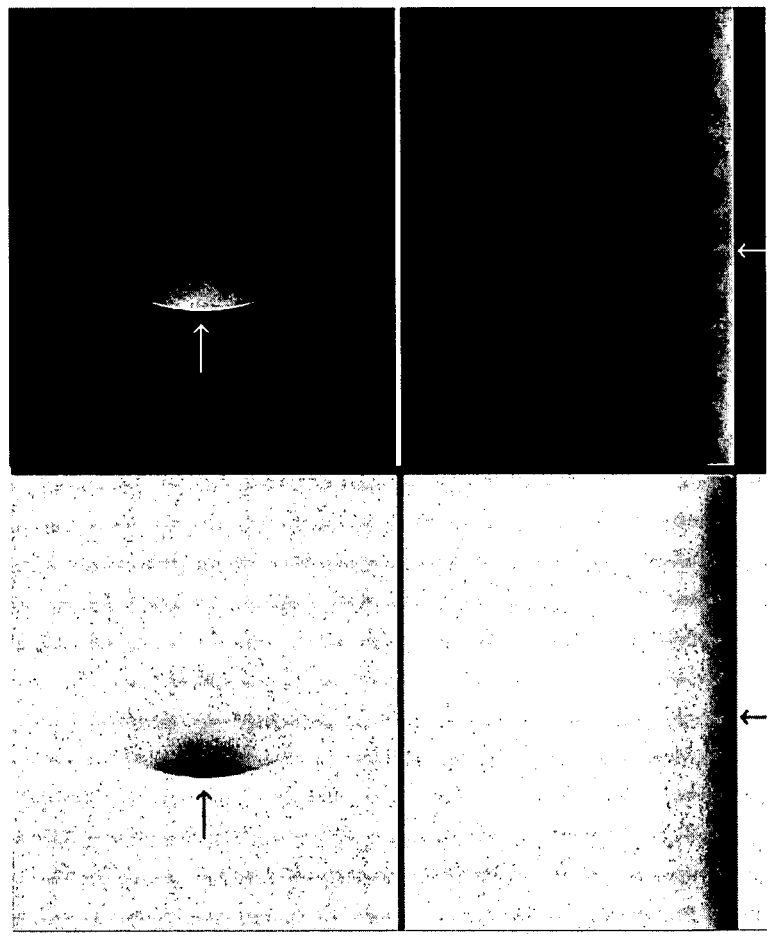
FIG. 24A shows positive and negative central axial and sagittal images of the solution phantom using one resonant slot as shown in FIG. 23.
Figure 24B:
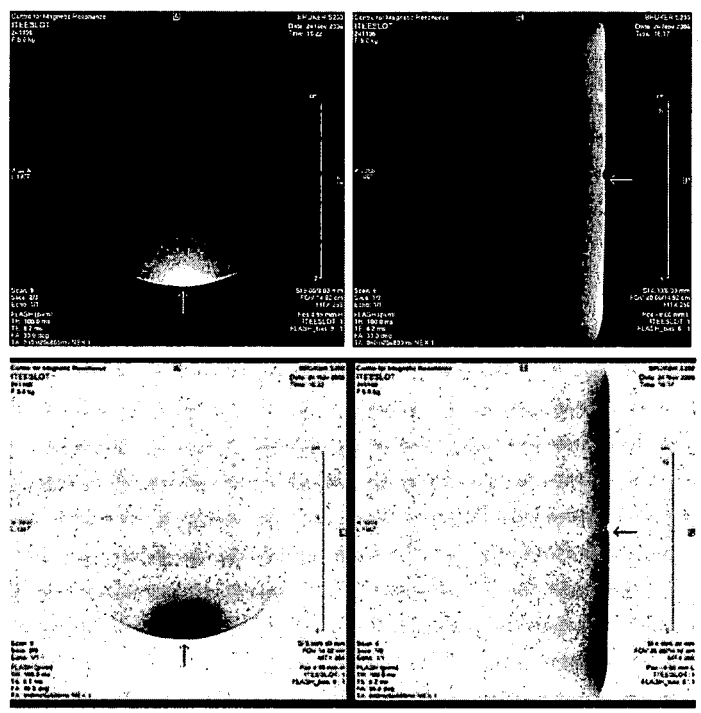
FIG. 24B shows positive and negative central axial and sagittal images of an example experimental result using one resonant slot as shown in FIG. 23; and, FIG. 24C shows positive and negative central axial and sagittal images of an example experimental result using one resonant and one non-resonant slot (180 degrees apart from the first) in an RF shield.

FIGS. 24A and 24B show the computer simulated and experimental results of the spatial profile of the RF field near the slot 1708 in both central axial and sagittal planes. The simulations and experimental results are corroborative. The field decays naturally with distance from the slot 1708.

The parameters of the imaging sequence were as follows: field of view (FOV)=approx. 15 cm×15 cm with a slice thickness (ST)=8 mm for the axial images, and FOV=approx. 20 cm×15 cm with ST=6 mm for sagittal images, respectively.

In another experimental example, a second 5 mm wide slot 1708 was made on the opposite end of the cylinder (i.e. 180 degrees apart from the first slot). Capacitors were at first omitted on the second slot, so that this slot was not resonating. The experiment was then repeated.

Figure 24C:
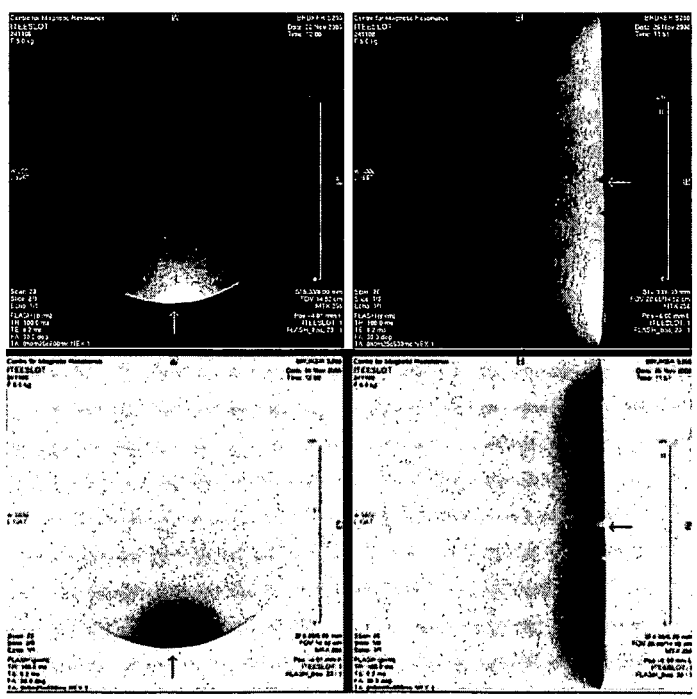

FIG. 24C shows the spatial profile of the RF field near the first slot 1708 in both central axial and sagittal planes when the second non-resonant slot was provided on the opposite side of the RF shield. It is evident that the field penetration depth has effectively increased towards the centre of the sample and that the first slot, which is resonating at 85.45 MHz, is very effective in allowing the field from the whole body RF resonator/receiver system 1702 to pass through the slot 1708 to the sample 1711.

These examples illustrate the power of RF field shaping by simply cutting slots 1708 into an RF shield and choosing to make the slots resonant or not resonant. Also by changing the shape and size of the slots 1708 in a particular shielding material 1707, additional degrees of freedom are obtained in the process of RF field tailoring.

In this example, when the slotted RF shield is attached to a rotor 1704 via an axle 1705 and rotated 1710 about its axis 1709, the entire sample 1711 is illuminated over time, and the MR signals are effectively received from the entire region of interest to be imaged as described above with respect to the coil moving apparatus.

It is evident that the moving RF shield invention is applicable to all existing MRI systems, is simple to implement, and does not require an inductively coupled connection as in the case of a moving (or otherwise rotating) RF coil.

Accordingly, the above described systems provide a moving apparatus that is capable of rotating or otherwise moving field components, such as coil structure(s) or shields in a controlled manner at a wide range of quantifiable periodic frequencies. This can be used within a standard MR configuration, such as a homogeneous polarizing static magnetic field produced by the main (superconducting) magnet and, if required, a plurality of gradient coils positioned about the bore of the magnet to produce the field gradients.

In one example, to acquire MR images, a RF chain and switch controlled by the pulse module, is used to transmit RF fields $B_1$ and receive decay or echo signals from the RF coil assembly. Furthermore, a computer program product with computer executable code, which when executed on a suitable processing system causes the processing system to control the overall RF transmission/reception and final image acquisition in the intended manner, can be provided.

In one example, RF coil or shield movement can be used as an additional degree of freedom to allow at least one coil sensitivity pattern to effectively imitate a plurality C of conventional stationary coils (channels) of a (parallel) imaging system. The moving apparatus can therefore reduce the number of lumped circuit elements, tedious mutual coupling issues associated with large (parallel) coil arrays and system cost, while it will facilitate major imaging time reductions. In addition, it allows for a wide range of coil geometries and rotational frequencies, thus aiding the development of novel ultra-fast imaging algorithms, radio-frequency (RF) coil architectures and methods.

The above described moving apparatus, and its use can therefore result in enhanced imaging system operation. In particular, by providing a coil, shield or other field component that can be moved with respect to an imaging region of the imaging system, this allows a wider range of measurements to be performed than is achievable with a standard static single channel coil arrangement. Additionally, the moving coil or shield can be used to implement multiple channel functionality, without the need for multiple channels. This vastly reduces the complexity of the imaging system and operation.

It will be appreciated that the examples described above utilize a single transceive RF (surface) coil but the moving apparatus is not limited to such an arrangement and any arrangement of number of coils and can, without any limitations, be applied to the design of transmit and/or receive-only multi-element or volumetric type of RF systems.

The experimental examples demonstrate the use of the rotating RF system in imaging of a uniform RF field $B_1$ map, anatomical imaging and selective excitation via multi-dimensional RF pulses and synchronously applied gradients.

It will further be appreciated that the coil or shield moving apparatus complements the applications of parallel imaging and accelerated spatially selective excitation (i.e. rotating transmit and receive SENSE).

Further applications of the rotating RF system relate to the equivalent of a birdcage resonator with a large number of stubs C and multi-tuned X-nuclei RF coils. It is noted that this coil moving apparatus does not apply only to the application examples listed herein and that further applications shall become apparent with the future use of this new technology.

Thus, the moving apparatus and associated methods may be applicable to a wide range of MRI techniques, such as Parallel Imaging (i.e. transmit and receive Sensitivity Encoding), X-nucleus MRI, Nuclear Magnetic Resonance Spectroscopy, dynamic MRI, functional MRI, Arterial Spin Labelling, Magnetic Resonance Angiography, Chemical Shift Imaging, Diffusion Tensor Imaging, among others.

The moving apparatus can be controlled together with a signal sampling rate to thereby allow an imaging rate to be controlled. In use, this allows a processing system to select a required imaging rate based on factors such as the required image quality, subject inconvenience, urgency for completion of the imaging, or the like, with this being used to control the movement of the field component and the sampling of detected echo signals, thereby allowing the desired imaging rate to be achieved.

It might become evident that simultaneous rotation (or movement) of two or more coil structures on different (or same) radii/planes, operated in transceive or cross-coil mode, at equal or different speed may also be used for further applications.

Whilst the above described examples have focussed on the use of RF coils to generate an RF field to cause excitation of the sample in MRI, it will be appreciated that the above described techniques can be used in other applications with any suitable frequency electromagnetic radiation, such as microwave radiation or the like. Thus, for example, the above described techniques could be used with ultra-wide band microwave technologies. Accordingly, it will be appreciated that the techniques can therefore be used for any electromagnetic field, although typically the techniques are used in applications involving non-ionising radiation due to the additional complexities in generating and in using ionising radiation.

Persons skilled in the art will appreciate that numerous variations and modifications will become apparent. All such variations and modifications, which become apparent to persons skilled in the art, should be considered to fall within the spirit and scope that the invention broadly appearing before described.

The invention claimed is:

1. Apparatus for use in a magnetic resonance imaging system, the imaging system being for generating a magnetic imaging field in an imaging region, the apparatus comprising:
   a) at least one coil for at least one of transmitting, receiving or transceiving an electromagnetic field;
   b) a field component; and,
   c) a drive coupled to the field component for moving the field component relative to the imaging region to thereby modify the electromagnetic field.

2. Apparatus according to claim 1, wherein the field component is at least one of:
   a) the at least one coil; and,
   b) a shield for partially shielding the at least one coil from the imaging region.

3. Apparatus according to claim 1, wherein movement of the field component is for modifying at least one of:
   a) the electromagnetic field generated by the at least one coil; and,
   b) a sensitivity distribution of the at least one coil.

4. Apparatus according to claim 1, wherein the drive is for at least one of:
   a) rotating the field component; and,
   b) moving the field component in a plane.

5. Apparatus according to claim 4, wherein the drive is for rotating the at least one coil about a rotation axis.

6. Apparatus according to claim 5, wherein a coil axis of the at least one coil is at least one of:
   a) aligned with the rotation axis; and,
   b) perpendicular to the rotation axis.

7. Apparatus according to claim 6, wherein the at least one coil is offset to the rotation axis.

8. Apparatus according to claim 4, wherein the rotation axis is aligned with the imaging region.

9. Apparatus according to claim 1, wherein the field component comprises a shield, the shield being a slotted shield structure.

10. Apparatus according to claim 1, wherein the drive comprises at least one of:
    a) a motor; and,
    b) a turbine.

11. Apparatus according to claim 1, wherein the drive is at least one of:
    a) electric;
    b) piezoelectric;
    c) pneumatic;
    d) hydraulic; and,
    e) non-magnetic.

12. Apparatus according to claim 1, wherein the apparatus comprises sensor for sensing movement of the field component.

13. Apparatus according to claim 1, wherein the apparatus comprises a processing system for at least one of:
    a) controlling movement of the field component; and,
    b) determining movement of the field component.

14. Apparatus according to claim 13, wherein the processing system determines at least one of:
    a) a frequency of rotation of the field component; and,
    b) a field component movement speed.

15. Apparatus according to claim 13, wherein the processing system at least one of:
    a) analyses measurements at least partially in accordance with the determined field component movement; and,
    b) causes an electromagnetic field to be transmitted at least partially in accordance with the determined field component movement.

16. Apparatus according to claim 13, wherein the processing system controls movement of the field component in accordance with at least one of:
    a) a frequency of a transmitted electromagnetic field; and,
    b) frequencies of a sequence of transmitted electromagnetic fields.

17. Apparatus according to claim 13, wherein the processing system triggers a measurement procedure.

18. Apparatus according to claim 1, wherein the apparatus comprises a processing system for at least one of:
    a) causing signals to be applied to the at least one coil; and,
    b) determining signals measured in the at least one coil.

19. Apparatus according to claim 18, wherein the at least one coil is wirelessly coupled to the processing system.

20. Apparatus according to claim 18, wherein the at least one coil is at least one of inductively and capacitively coupled to the processing system.

21. Apparatus according to claim 13, wherein the processing system causes measurements to be performed whilst the field component is moving.

22. Apparatus according to claim 1, wherein the apparatus comprises a plurality of coils, and wherein in use, each coil is used for at least one of:
    a) transmitting (a segment of) electromagnetic pulse samples; and,
    b) receiving respective decay or echo signals.

23. Apparatus according to claim 1, wherein the apparatus comprises a plurality of coils arranged to image a three-dimensional (3D) volume of a subject.

24. Apparatus according to claim 23, wherein each coil is tuned to a different frequency in order to at least one of:
    a) transmitting electromagnetic pulse samples to a respective slice of the subject; and,
    b) receiving a respective decay or echo signals from a respective slice of the subject.

25. Apparatus according to claim 1, wherein the apparatus is adapted for at least one of:
    a) Multi-nuclear imaging.
    b) Multi-nuclear spectroscopy.

26. Apparatus according to claim 1, wherein the field component comprises a shield, the shield comprising at least one slot.

27. Apparatus according to claim 26, wherein the slotted shield comprises at least one of:
    a) slots of circular or elliptical geometry; and,
    b) electronic components for matching resonant properties of the shield to a frequency or impedance of interest.

28. Apparatus according to claim 26, wherein the shield comprises multiple slots arranged along a direction of multiple slices to be imaged.

29. Apparatus according to claim 28, wherein the slots are for differentiating the imaged slices by at least one of:
    a) different geometrical properties of the slot; and,
    b) different resonance frequencies of the slot.

30. Apparatus according to claim 26, wherein field component comprises a plurality of shields, at least two shields being arranged to move independently.

31. Apparatus according to claim 26, wherein at least one of a geometry and material properties of the shield vary as function of space.

32. Apparatus according to claim 26, wherein a geometry of slot(s) in the shield is adjustable.

33. Apparatus according to claim 32, wherein a processing system controls the geometry of slot(s) depending on a position or movement of the field component.

34. Apparatus according to claim 26, wherein the shield comprises adjustable electronic circuit components for adjusting electromagnetic properties of the shield.

35. Apparatus according to claim 34, wherein a processing system adjusts the electronic circuit components.

36. Apparatus according to claim 1, wherein movement of the shield can be coupled independent of the system electromagnetic coils.

37. Apparatus according to claim 1, wherein the field component comprises a plurality of coils, at least two coils being arranged to move independently.

38. Apparatus according to claim 37, wherein the at least two coils are adapted to rotate about different rotation axes.

39. Apparatus according to claim 37, wherein the at least two coils are adapted to rotate with at least one of:
    a) different speeds;
    b) different accelerations; and,
    c) different orientations.

40. Apparatus according to claim 1, wherein the apparatus is for reducing a Specific Absorption Rate (SAR) during the imaging procedure.

41. Apparatus according to claim 1, wherein the apparatus is for modifying the electromagnetic field so that the modified electromagnetic field provides a modulation function for amplitude encoding transmitted or received electromagnetic signals.

42. Apparatus according to claim 1, wherein the apparatus is for imaging by amplitude modulating/encoding the transmitted or received electromagnetic signals to and from the sample in conjunction with some or without any switching of magnetic field gradient coils.

43. Apparatus according to claim 1, wherein the field component is mounted on a body, the body being coupled to the drive to thereby cause movement of the body.

44. Apparatus according to claim 1, wherein the electromagnetic field is at least one of:
 a) an RF field; and,
 b) non-ionising.

45. Apparatus according to claim 1, wherein the apparatus comprises a processing system for controlling an imaging rate by controlling at least one of:
 a) a rate of movement of the field component; and,
 b) a rate of sampling of signals measured in the at least one coil.

46. A method for use in a magnetic resonance imaging system, the imaging system being for generating a magnetic imaging field in an imaging region, and comprising:
 a) at least one coil for at least one of transmitting, receiving or transceiving an electromagnetic field;
 b) a field component; and,
 c) a drive coupled to the field component, wherein the method comprises moving the field component relative to the imaging region to thereby modify the electromagnetic field.

47. A method according to claim 46, wherein the method comprises moving the field component to modify at least one of:
 a) an electromagnetic field generated by the at least one coil; and,
 b) a sensitivity distribution of the at least one coil.

48. A method according to claim 46, wherein the method comprises, in a processing system, at least one of:
 a) controlling movement of the field component; and,
 b) determining movement of the field component.

49. A method according to claim 48, wherein the method comprises, controlling movement of the at least one coil in accordance with measurements being performed.

50. A method according to claim 48, wherein the at least one coil rotates relative to the imaging region, and wherein the method comprises controlling the rotation speed.

51. A method according to claim 48, wherein the method comprises controlling electromagnetic signals applied to the at least one coil.

52. A method according to claim 48, wherein the method comprises, in the processing system, controlling at least one of:
 a) a frequency of rotation of the field component; and,
 b) a field component movement speed.

53. A method according to claim 48, wherein the method comprises, in the processing system, determining at least one of:
 a) a frequency of rotation of the field component; and,
 b) a field component movement speed.

54. A method according to any claim 48, wherein the method comprises, in the processing system, at least one of:
 a) analysing measurements at least partially in accordance with the determined field component movement; and,
 b) causing an electromagnetic field to be transmitted at least partially in accordance with the determined field component movement.

55. A method according to claim 48, wherein the method comprises, in the processing system, controlling movement of the field component in accordance with frequencies of a sequence of transmitted electromagnetic fields.

56. A method according to claim 48, wherein the method comprises controlling an imaging rate by controlling at least one of:
 a) a rate of movement of the field component; and,
 b) a rate of sampling of signals measured in the at least one coil.

57. Apparatus for use in a magnetic resonance imaging system, the imaging system being for generating a magnetic imaging field in an imaging region, the apparatus comprising:
 a) at least one coil for at least one of transmitting, receiving or transceiving an electromagnetic field;
 b) a field component comprising at least one of:
  i) the at least one coil; and,
  ii) a shield for partially shielding the at least one coil from the imaging region; and,
 c) a drive coupled to the field component for moving the field component relative to the imaging region, during imaging.

58. A method for use in a magnetic resonance imaging system, the imaging system being for generating a magnetic imaging field in an imaging region, and comprising:
 i) at least one coil for at least one of transmitting, receiving or transceiving an electromagnetic field;
 ii) a field component comprising at least one of:
  (1) the at least one coil; and,
  (2) a shield for partially shielding the at least one coil from the imaging region; and,
 iii) a drive coupled to the field component, wherein the method comprises moving the field component relative to the imaging region using the drive, during imaging.

59. Apparatus for use in a magnetic resonance imaging system, the imaging system being for generating a magnetic imaging field in an imaging region, the apparatus comprising:
 a) at least one coil for at least one of transmitting, receiving or transceiving an electromagnetic field;
 b) a body comprising at least one of:
  i) the at least one coil; and,
  ii) a shield for partially shielding the at least one coil from the imaging region; and,
 c) a drive coupled to the body for moving the body relative to the imaging region, during imaging.

60. A method for use in a magnetic resonance imaging system, the imaging system being for generating a magnetic imaging field in an imaging region, and comprising:
 a) at least one coil for at least one of transmitting, receiving or transceiving an electromagnetic field;
 b) a body comprising at least one of:
  i) the at least one coil; and,
  ii) a shield for partially shielding the at least one coil from the imaging region; and,
 c) a drive coupled to the body, and wherein the method comprises moving the body relative to the imaging region using the drive, during imaging.

61. Apparatus for use in a magnetic resonance imaging system, the imaging system being for generating a magnetic imaging field in an imaging region, the apparatus comprising:
 a) a body;
 b) at least one coil mounted on the body, the at least one coil being for transmitting or receiving an RF field; and,
 c) a drive coupled to the body for rotating the coil relative to the imaging region, during imaging.

62. A method for use in imaging a sample provided in an imaging region of a magnetic resonance imaging system, the method comprising, in a processing system:
 a) causing at least one coil to be moved relative to the imaging region during imaging, the at least one coil being for transmitting or receiving an RF field; and, b) at least one of:
  i) causing a sequence of electrical signals to be applied to the coil; and,
  ii) determining measurements of electrical signals in the coil.

63. Apparatus for use in a magnetic resonance imaging system, the imaging system being for generating a magnetic imaging field in an imaging region, the apparatus comprising:
  a) at least one field source/sensor for at least one of transmitting, receiving or transceiving an electromagnetic field; and,
  b) a drive coupled to the at least one field source/sensor for moving the at least one field source/sensor relative to the imaging region, during imaging.

64. A method for use in a magnetic resonance imaging system, the imaging system being for generating a magnetic imaging field in an imaging region, and comprising:
  a) at least one field source/sensor for at least one of transmitting, receiving or transceiving an electromagnetic field; and,
  b) a drive coupled to the at least one field source/sensor, wherein the method comprises moving the at least one field source/sensor relative to the imaging region, during imaging.

65. Apparatus for use in a magnetic resonance imaging system, the imaging system being for generating a magnetic imaging field in an imaging region, the apparatus comprising:
  a) a source for generating an electromagnetic field; and,
  b) means for spatially changing the electromagnetic field over time relative to a subject being imaged, during imaging.

66. A method for use in a magnetic resonance imaging system, the imaging system being for generating a magnetic imaging field in an imaging region, the method comprising:
  a) generating an electromagnetic field; and,
  b) spatially changing the electromagnetic field over time relative to a subject being imaged during imaging.

67. Apparatus according to claim 1, wherein the field component is moved during imaging.

68. Apparatus according to claim 1, wherein the apparatus includes a processing system for interpreting measurements at least partially in accordance with movement of the field component.

* * * * *